(12) United States Patent
Kim

(10) Patent No.: US 9,511,497 B2
(45) Date of Patent: Dec. 6, 2016

(54) PITCH CONTROL UNIT, PICKER HAVING THE PITCH CONTROL UNIT AND TEST HANDLER HAVING THE PICKER

(71) Applicant: Bum-Sic Kim, Cheonan-si (KR)

(72) Inventor: Bum-Sic Kim, Cheonan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/749,828

(22) Filed: Jun. 25, 2015

(65) Prior Publication Data

US 2015/0375400 A1 Dec. 31, 2015

(30) Foreign Application Priority Data

Jun. 26, 2014 (KR) .................. 10-2014-0078576

(51) Int. Cl.
*B66C 1/02* (2006.01)
*B25J 15/00* (2006.01)

(52) U.S. Cl.
CPC .................. *B25J 15/0052* (2013.01)

(58) Field of Classification Search
CPC ...... B25J 15/0052; B25J 15/06; B66C 1/0237; B66C 1/0243; B65G 47/918; B65G 47/907; B65B 35/38
USPC ............ 294/65, 87.1; 414/416.02; 198/468.3
See application file for complete search history.

(56) References Cited

U.S. PATENT DOCUMENTS

| | | | | |
|---|---|---|---|---|
| 6,068,317 A | * | 5/2000 | Park | H01L 21/68 294/65 |
| 6,346,682 B2 | | 2/2002 | Kim et al. | |
| 6,406,246 B1 | | 6/2002 | Itoh et al. | |
| 6,439,631 B1 | * | 8/2002 | Kress | B65G 47/918 294/65 |
| 6,446,354 B1 | | 9/2002 | Na | |
| 7,390,040 B2 | * | 6/2008 | Subotincic | B25J 15/0052 198/468.3 |
| 7,464,807 B2 | * | 12/2008 | Ham | G01R 31/2893 198/468.3 |
| 8,141,922 B2 | * | 3/2012 | Shim | H01L 21/6838 294/65 |

(Continued)

FOREIGN PATENT DOCUMENTS

| | | |
|---|---|---|
| JP | 2005-170622 A | 6/2005 |
| KR | 10-0082490 B1 | 2/1995 |

(Continued)

*Primary Examiner* — Gabriela Puig
(74) *Attorney, Agent, or Firm* — Lee & Morse P.C.

(57) ABSTRACT

A pitch control unit includes a base plate having an opening therethrough, a linear driver attached to the base plate in the opening, the linear driver including a plurality of rods linearly movable in a first direction, the rods being spaced apart from each other in a second direction, a stopper box attached to the base plate and including a plurality of stopper bodies, the plurality of stopper bodies individually face the plurality of rods of the linear driver to stop respective moveable rods at different moving distances from each other, and a picker holder attached to the linear driver, the plurality of rods of the linear driver being individually attached to pickers arranged in the first direction to pick the objects, and a picker pitch of the pickers being controlled by the moving distances of the plurality of rods.

20 Claims, 19 Drawing Sheets

(56) References Cited

U.S. PATENT DOCUMENTS

| | | | |
|---|---|---|---|
| 8,594,833 B2 * | 11/2013 | Goodman | B65G 47/918 198/468.3 |
| 8,653,845 B2 | 2/2014 | Shim et al. | |
| 2007/0152655 A1 | 7/2007 | Ham et al. | |

FOREIGN PATENT DOCUMENTS

| | | |
|---|---|---|
| KR | 10-2000-0065748 A | 11/2000 |
| KR | 10-2002-0000259 A | 1/2002 |
| KR | 10-0560729 B1 | 3/2006 |
| KR | 10-2006-0068675 A | 6/2006 |
| KR | 10-2008-0102746 A | 11/2008 |
| KR | 10-1034343 B1 | 5/2011 |
| KR | 10-2012-0134592 A | 12/2012 |
| KR | 10-2013-0061836 A | 6/2013 |

* cited by examiner

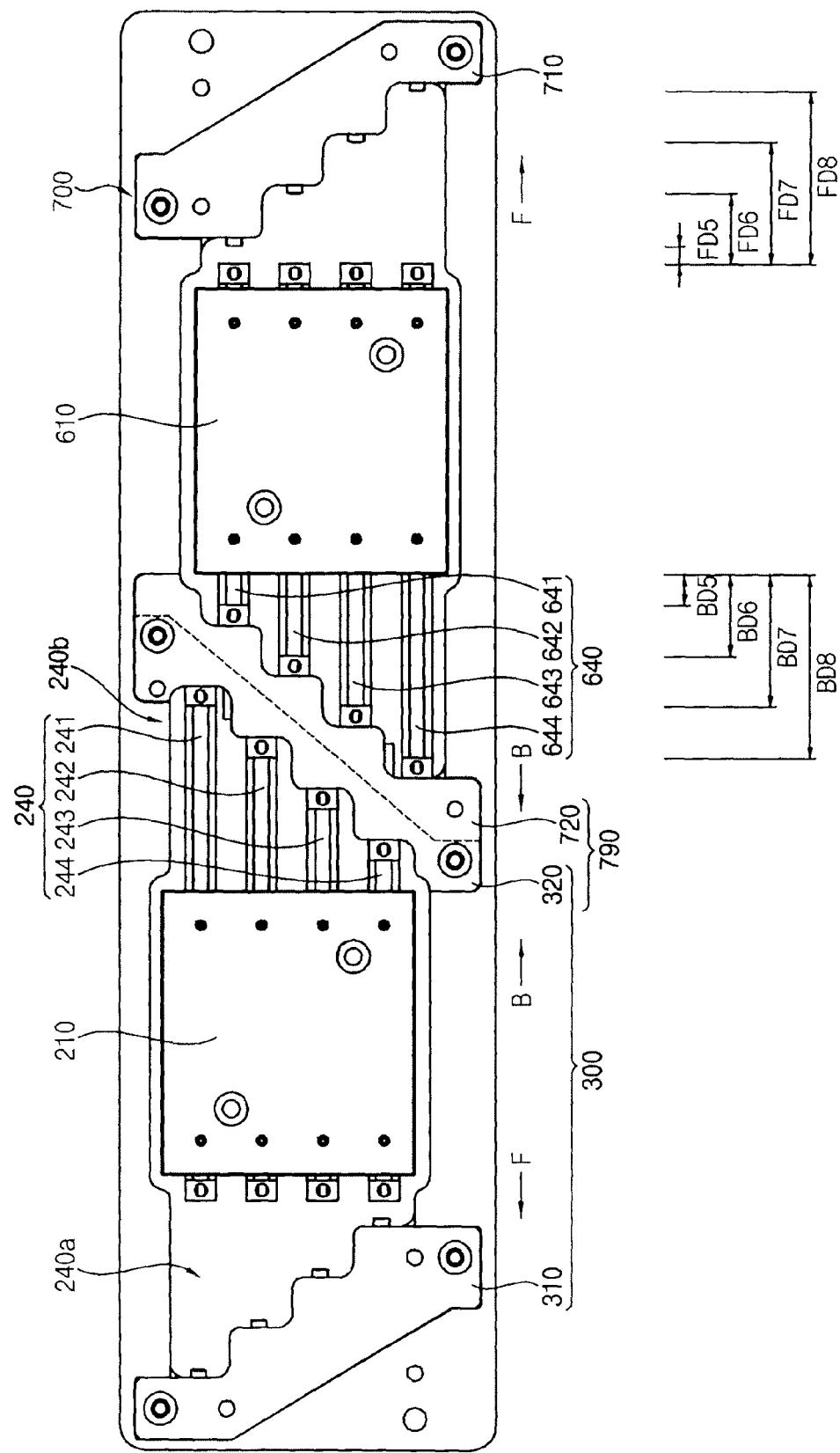

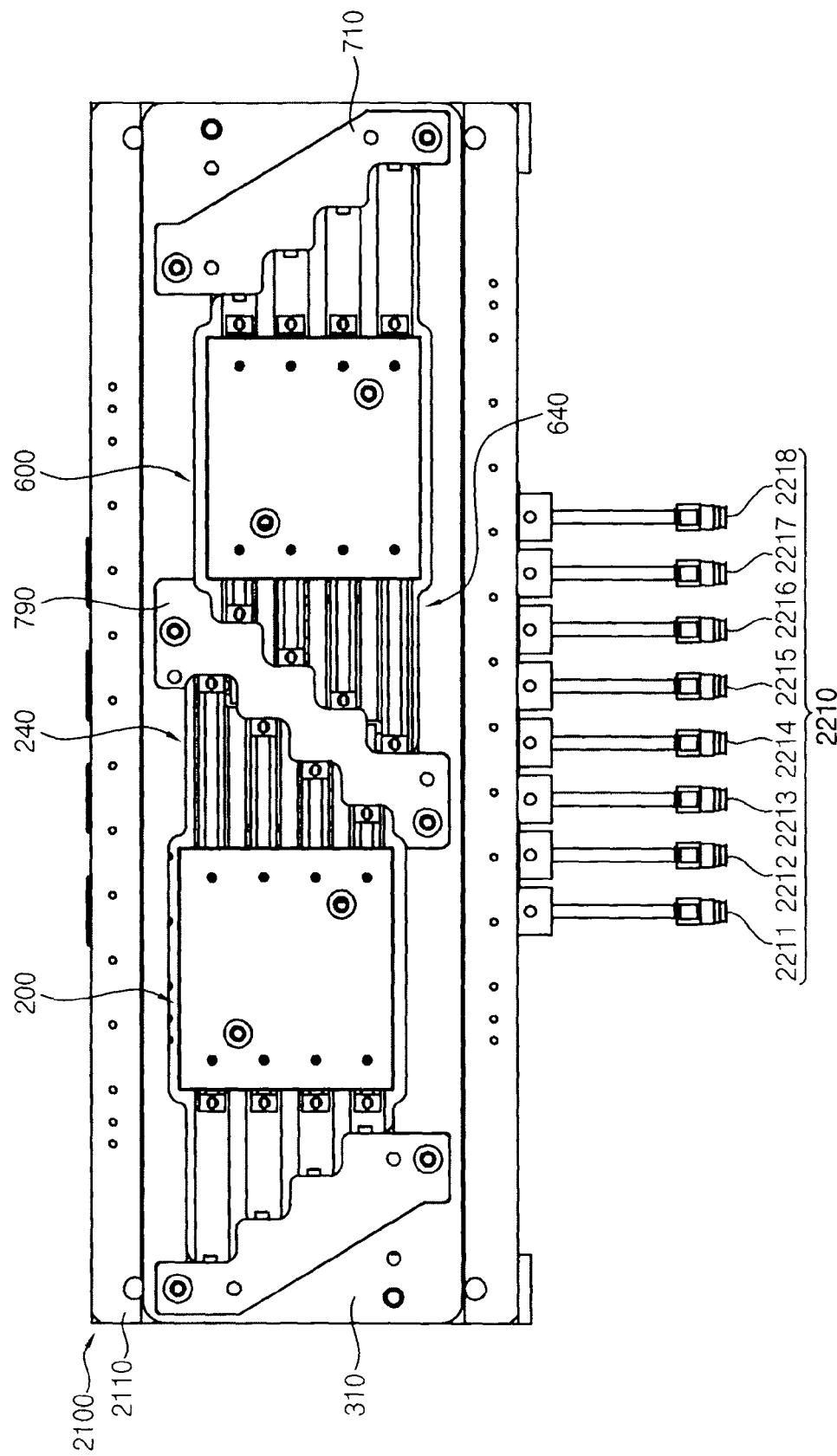

PITCH CONTROL UNIT, PICKER HAVING THE PITCH CONTROL UNIT AND TEST HANDLER HAVING THE PICKER

CROSS-REFERENCE TO RELATED APPLICATION

Korean Patent Application No. 10-2014-0078576, filed on Jun. 26, 2014, in the Korean Intellectual Property Office, and entitled: "Pitch Control Unit, Picker Having the Pitch Control Unit and Test Handler Having the Picker," is incorporated by reference herein in its entirety.

BACKGROUND

1. Field

Example embodiments relate to a pitch control unit, a picker having the pitch control unit, and a test handler having the picker. More particularly, example embodiments relate to a pitch control unit for controlling a picker pitch by linearly moving cylinders, a picker having the pitch control unit, and a test handler having the picker for transferring semiconductor devices under test to a test tray from a customer tray.

2. Description of the Related Art

Semiconductor devices usually undergo various electrical testing processes in a manufacturing process or a packaging process, e.g., an electrical die sorting (EDS) process in the manufacturing process. In general, the electrical testing process may be performed by an automatic test equipment (ATE), i.e., a device under test (DUT) is automatically connected to a test center by a test handler and an electrical test or measurement is conducted on the DUT by the test center.

When a plurality of the DUTs is received in customer trays of a customer stack of the test handler, the DUTs are individually picked up from the customer trays and are transferred into test trays by a picker assembly. Then, a plurality of the test trays is sequentially loaded into a test chamber that may be electrically connected to the test center via a test head. Since the DUTs are picked up individually from the customer trays by the picker assembly, the number of the DUTs that are simultaneously picked up and transferred to the test tray is determined by the number of the pickers.

In a conventional test handler, a device gap between the DUTs of the user tray is different from that of the test tray, thus a picker pitch is necessarily varied corresponding to the device gap of the DUTs as the picker assembly moves between the user tray and the test tray. For that reason, a pitch control unit is installed in the picker of the conventional test handler, so the picker pitch is controlled to increase as the picker assembly moves from the user tray to the test tray and controlled to decrease as the picker assembly moves from the test tray to the customer tray.

SUMMARY

Example embodiments provide a pitch control unit for a picker assembly in which a picker pitch is directly controlled by a linear driver, to thereby simplify the motion and structure of the pitch controller.

Other example embodiments provide a picker assembly including the above pitch control unit.

Still other example embodiments provide a test handler including the picker assembly.

According to exemplary embodiments, a pitch control unit may include a base plate having an opening therethrough, a linear driver attached to the base plate in the opening, the linear driver including a plurality of rods linearly movable in a first direction, the rods being spaced apart from each other in a second direction, a stopper box attached to the base plate and including a plurality of stopper bodies, the plurality of stopper bodies individually face the plurality of rods of the linear driver to stop respective moveable rods at different moving distances from each other, and a picker holder attached to the linear driver, the plurality of rods of the linear driver being individually attached to pickers arranged in the first direction to pick the objects, and a picker pitch of the pickers being controlled by the moving distances of the plurality of rods.

For example, the linear driver may include a pneumatic actuator having a cylinder into which a compressed air may flow, a piston that may be positioned in the cylinder and connected with the rods and a controller that controls the piston to linearly move forward or backward in the first direction by changing air flow of the compressed air.

For example, the stopper box may include a forward stopper box for stopping forward movements of the rods individually and a backward stopper box for stopping backward movements of the rods individually.

For example, the picker holder may include a plurality of holders corresponding to the rods by one to one and each of the holders may include a slim body extending in the first direction, a picker connector protruded from the slim body and connected to the picker and a rod connector protruded from the slim body and connected to the rod through the opening.

For example, the picker connectors may be arranged in the second direction while being shifted according to the moving distances of the corresponding rod in the first direction, so that the pickers may be arranged at one of a maximal pitch and a minimal pitch when the rods make individual contact with the stopper bodies.

For example, the base plate and the stopper box may be integrated into one body.

According to other example embodiments, there is provided a picker assembly including a mother plate having first and second faces opposite to each other and a plurality of connection holes penetrating therethrough, a picking unit secured to the second face of the mother plate and having a plurality of pickers that may be arranged and movable in a first direction, the pickers picking the objects from one of a customer tray and a test tray, a housing combined to the mother plate to cover the second face, thereby protecting the picking unit from surroundings, and a pitch control unit secured to the first face of the mother plate and connected to the picking unit through the connection holes. The pitch control unit may drive the pickers to move linearly in the first direction and control a picker pitch between the neighboring pickers.

For example, the pitch control unit includes a base plate secured to the mother plate and having a penetrating opening that may be communicated with the connection holes, a linear driver combined to the base plate in the opening and having a plurality of rods that may be linearly moving in the first direction and be arranged in a second direction, a stopper box combined to the base plate corresponding to the linear driver and having a plurality of stopper bodies individually facing the rods such that the stopper body may individually stop linear movement of the corresponding rod and moving distances of the rods may be different from one another, and a picker holder combined to the linear driver in such a configuration that the rods may be combined to the pickers by one to one, so that the picker pitch may be controlled by the moving distance of each rod.

For example, the linear driver may include a pneumatic actuator for driving a piston connected to the rods to linearly move forwards and backwards in the first direction, and the stopper box may include a forward stopper box for individually stopping forward movements of the rods and a backward stopper box for individually stopping backward movements of the rods.

For example, the pneumatic actuator may include first and second double acting cylinder structures that may be arranged in the first direction, and the stopper box may include a first forward stopper box for individually stopping forward movements of first rods that may be connected with the first double acting cylinder structure, a first backward stopper box for individually stopping backward movements of the first rods, a second forward stopper box for individually stopping forward movements of second rods that may be connected with the second double acting cylinder structure and a second backward stopper box for individually stopping backward movements of the second rods.

For example, a plurality of the pickers may be connected to the first and the second rods sequentially and be arranged in a line along the first direction, and the first backward stopper box and the second backward stopper box may be positioned adjacent to each other at a central portion of the base plate in such a way that the pickers may be arranged at a maximal pitch when the first and the second rods may move forwards to both end portions of the base plate along the first direction are and be arranged with minimal pitch when the first and the second rods may move backwards to the central portion of the base plate along the first direction.

For example, the moving distances of the first rods may decrease along the second direction and the moving distances of the second rods may increase along the second direction.

For example, the picking unit may include at least a guide rail secured to the second face of the mother plate and extending along the first direction and a plurality of guide blocks combined to the guide rail in a line along the first direction and moving along the guide rail. The pickers may be secured to the guide blocks and move in the first direction together with the guide block.

For example, the picker may include an absorber absorbing the object from the customer tray or the test tray, a picker driver driving the absorber to reciprocate in the second direction and a picker joint combined to the guide block.

For example, the picker driver may include a pneumatic cylinder structure having a piston that reciprocates in the second direction and the absorber may include a vacuum port for applying a vacuum pressure to the pneumatic cylinder structure and a contact pad to which the object may be absorbed and secured by the vacuum pressure.

For example, the picker holder may include a plurality of holders corresponding to the rods by one to one, and each of the holders may include a slim body extending in the first direction, a picker connector protruded from the slim body and connected to the guide block through the connection hole and a rod connector protruded from the slim body and connected to the rod through the opening, and the connection hole may have a hole length greater than the reciprocating distance of the rod corresponding thereto.

According to exemplary embodiments, the test handler may include a transfer line, a transfer block movably combined to the transfer line and a picker assembly combined to the transfer block and moving along the transfer line such that the picker assembly may be aligned with an underlying tray containing a plurality of the semiconductor packages and may pick up or locates down a plurality of the semiconductor packages from or into the tray. The picker assembly may include a mother plate having first and second faces opposite to each other and a plurality of connection holes penetrating therethrough, a picking unit secured to the second face of the mother plate and having a plurality of pickers that may be arranged and movable in a first direction and pick up the semiconductor packages from the tray, a housing combined to the mother plate to cover the second face, thereby protecting the picking unit from surroundings, and a pitch control unit secured to the first face of the mother plate and connected to the picking unit through the connection holes. The pitch control unit may drive the pickers to move linearly in the first direction and may control a picker pitch between the neighboring pickers.

For example, the pitch control unit may include a base plate secured to the mother plate and having a penetrating opening that may be communicated with the connection holes, a linear driver combined to the base plate in the opening and having a plurality of rods that may linearly move in the first direction and be arranged in a second direction, a stopper box combined to the base plate corresponding to the linear driver and having a plurality of stopper bodies individually facing the rods such that the stopper body individually may stop linear movement of the corresponding rod and moving distances of the rods are different from one another, and a picker holder combined to the linear driver in such a configuration that the rods may be individually combined to the pickers, so that the picker pitch may be controlled by the reciprocating distance of each rod.

For example, the linear driver may include a pneumatic actuator for driving a piston, which may be connected to the rod, to linearly move forwards and backwards in the first direction, and the stopper box may include a forward stopper box for stopping forward movements of the rods, respectively, and a backward stopper box for stopping backward movements of the rods, respectively.

For example, the pneumatic actuator may include first and second double acting cylinder structures that may be arranged in the first direction, and the stopper box may include a first forward stopper box for stopping forward movements of first rods that may be connected with the first double acting cylinder structure, respectively, and a first backward stopper box for stopping backward movements of the first rods, respectively, a second forward stopper box for stopping forward movements of second rods that may be connected with the second double acting cylinder structure, respectively, and a second backward stopper box for stopping backward movements of the second rods, respectively.

According to exemplary embodiments, a pitch control unit may include a base plate having an opening therethrough, a linear driver attached to the base plate in the opening, the linear driver including a plurality of rods linearly movable in a first direction within the opening of the base plate, the plurality of rods being spaced apart from each other in a second direction, a stopper box attached to the base plate and including a plurality of stopper bodies, the plurality of stopper bodies facing corresponding rods and being arranged at different distances from the corresponding rods, and a picker holder attached to the plurality of rods through the opening, each rod of the plurality of rods being connected to a corresponding picker via an independent picker connector, and a picker pitch of the pickers being defined by distances between picker connectors in accordance with the different distances of the stopper bodies.

For example, the picker holder may include a plurality of holders spaced apart from each other in the second direction and corresponding to the plurality of rods, each of the plurality of holders including a linear member extending in the first direction, the picker connector protruding from the linear member and connected to a corresponding picker of the pickers, the picker connector extending along a direction normal to a surface of the base plate, a rod connector protruding from the linear and connected to a corresponding rod of the plurality of rods through the opening.

For example, the plurality of stopper bodies may be arranged in a descending step structure along the second direction, the distances between the stopper bodies and the corresponding rods being measured along the first direction and being gradually decreasing along the second direction, and the plurality of rods being movable along the decreasing distances.

For example, the picker connectors of the picker holder may be spaced apart from each other along the second direction and are movable with the plurality of rods, respectively, the picker pitch corresponding to spaces between adjacent picker connectors.

For example, the plurality of rods may be movable simultaneously.

BRIEF DESCRIPTION OF THE DRAWINGS

Features will become apparent to those of ordinary skill in the art by describing in detail exemplary embodiments with reference to the attached drawings, in which:

FIG. 7A illustrates a front view of the pitch control unit shown in FIG. 6;

FIG. 10A illustrates a front view of the picker assembly shown in FIG. 9;

DETAILED DESCRIPTION

Figure 1:
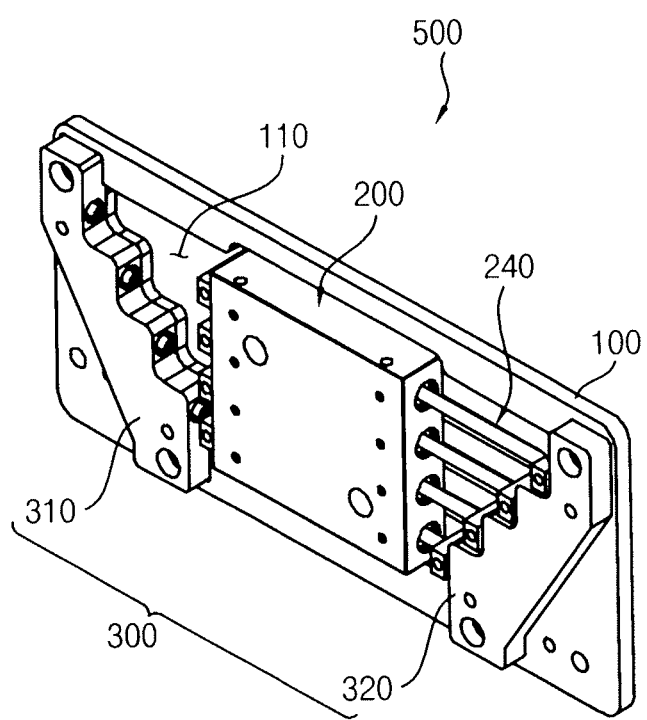
FIG. 1 illustrates a perspective view of a pitch control unit for a picker assembly of a test handler in accordance with an exemplary embodiment.
Figure 1:
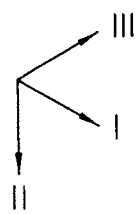

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will be understood that when an element or layer is referred to as being "on," "connected to" or "coupled to" another element or layer. It can be directly on, connected or coupled to the other element or layer or intervening elements or layers may be present. In contrast, when an element is referred to as being "directly on," "directly connected to" or "directly coupled to" another element or layer, there are no intervening elements or layers present. In addition, it will also be understood that when an element or layer is referred to as being "between" two elements or layers, it can be the only element or layer between the two elements or layers, or one or more intervening elements or layers may also be present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to illustrations that are schematic illustrations of idealized example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to limit the scope of the embodiments.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Pitch Control Unit

Figure 2A:
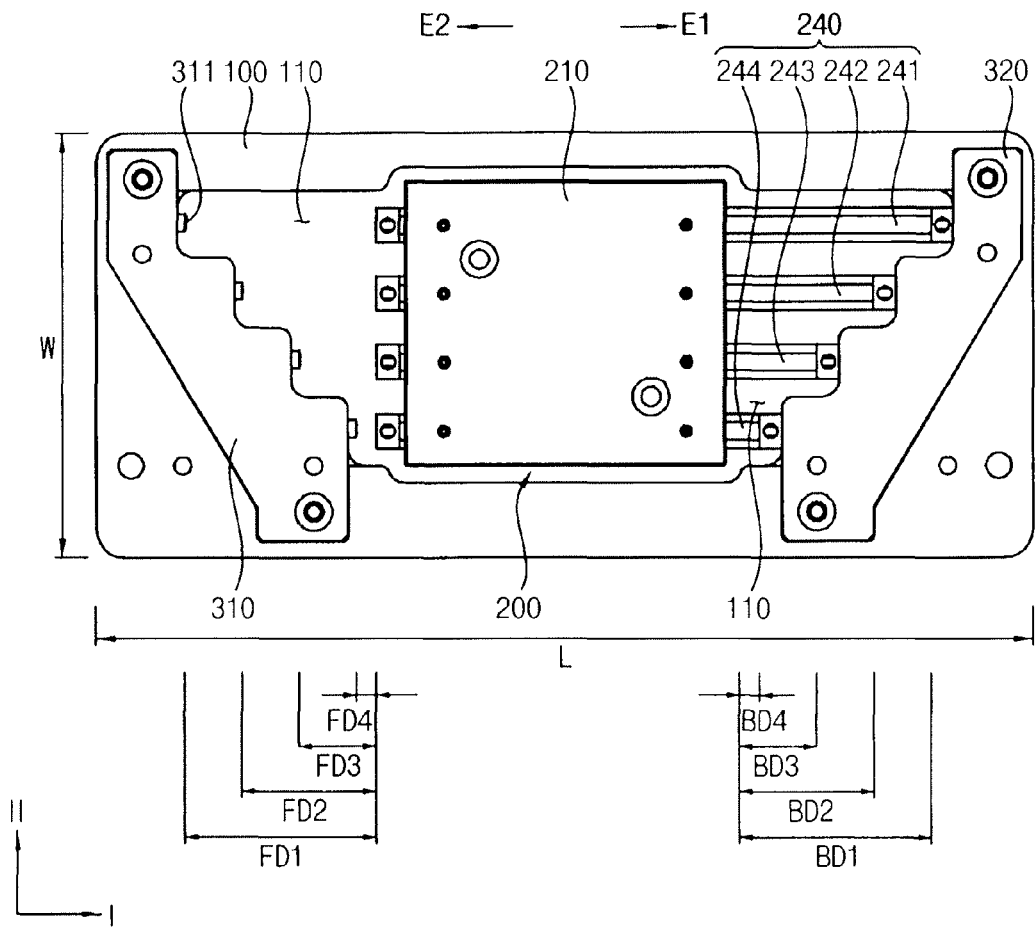
FIG. 2A illustrates a front view of the pitch control unit shown in FIG. 1.

FIG. 1 is a perspective view illustrating a pitch control unit for a picker assembly of a test handler in accordance with an exemplary embodiment. FIG. 2A is a front view illustrating the pitch control unit shown in FIG. 1, and FIG. 2B is a top plan view illustrating the pitch control unit shown in FIG. 1.

Figure 2B:
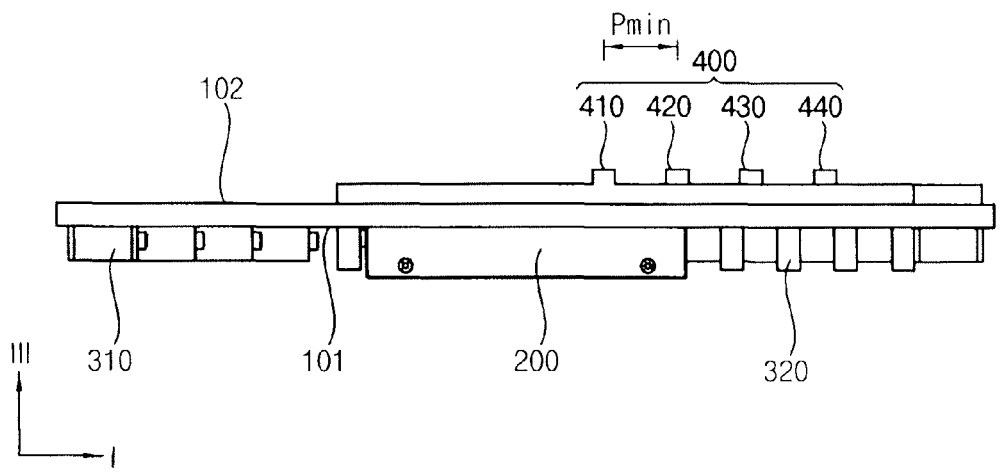
FIG. 2B illustrates a top plan view of the pitch control unit shown in FIG. 1.

Referring to FIGS. 1, 2A and 2B, a pitch control unit 500 for a picker of a test handler in accordance with an exemplary embodiment may include a base plate 100 having an opening 110 penetrating therethrough, and a linear driver 200 combined with, e.g., attached to, the base plate 100 in the opening 110 and having a plurality of piston rods 240, e.g., first to fourth rods 241 to 244, that may be linearly reciprocating, e.g., moving, in a first direction I and may be arranged in a second direction II substantially perpendicular to the first direction I. The pitch control unit 500 may further include a stopper box 300 combined with, e.g., attached to, the base plate 100 and corresponding to the linear driver 200 to have a plurality of stopper bodies, e.g., first to fourth stopper bodies 311 to 314, individually facing the plurality of piston rods 240, e.g., first to fourth rods 241 to 244, such that the stopper bodies 311 to 314 may individually stop linear movement of corresponding rods 241 to 244. Reciprocating, e.g., moving, distances of the rods 241 to 244 may be different from one another.

The pitch control unit 500 may further include a picker holder 400 (FIG. 2B) combined to the linear driver 200 in such a configuration that the rods 241 to 244 may be combined individually, i.e., one-to-one, to pickers (not shown) that may be arranged in the first direction I to pick objects, e.g., DUTs from a tray. Accordingly, a picker may move according to the reciprocating distances of the rods 241 to 244, and thus, the picker pitch, i.e., a gap distance between neighboring pickers, may be controlled by the reciprocating distance of each rod 241 to 244. That is, the picker pitch may be directly controlled by the linear driver 200 without any intermediate driving members, e.g., without a linker system or a cam driver.

In detail, as illustrated in FIG. 2A, the base plate 100 may be a rectangular plate having a length L extending in the first direction I and a width W extending in the second direction II. As illustrated in FIG. 2B, the stopper box 300 may be combined, e.g., attached, to a first surface 101 of the base plate 100, and the pick holder 400 may be combined, e.g., attached, to a second surface 102 of the base plate 100, i.e., to s surface opposite to the first surface 101 of the base plate 100. While the present example embodiment discloses a rectangular base plate 100, the base plate 100 may be shaped into any other convenient shape according to the configurations and structures of the pickers and test handler included in the picker assembly.

As illustrated in FIG. 1, the base plate 100 may include an opening 110 penetrating therethrough in a third direction III perpendicular to both of the first and the second directions I and II. The linear driver 200 may be positioned in the opening 110 of the base plate 100, so that the configurations of the opening 110 may be varied according to the number and configurations of the linear driver 200. The opening 110 may have a length sufficiently larger than a stroke of the piston rods 240 in the first direction I and have a sufficient size to include the piston rods 240 in the second direction II. A width of the opening 110 in the third direction III may equal a width of the piston rods 240 in the third direction III. In the present example embodiment, the plurality of the rods 241 to 244 may be included in the opening 110 and be vertically arranged in the second direction II, i.e., the plurality of the rods 241 to 244 may extend in the first direction I within the opening 110 and may be spaced apart form each other in the second direction II within the opening 110.

For example, as illustrated in FIGS. 1 and 2A, the linear driver 200 may be positioned at, e.g., a center of, the opening 110, and may be secured to upper and lower portion of the base plate 100 around the opening 110. In another example, a securing plate may be provided with the opening 110, and the linear driver 200 may be installed, e.g., secured, to the securing plate. For example, a portion of the base plate 100 may remain at a center of the opening 110, and the securing plate may be installed, e.g., attached, to the remaining portion of the base plate 100 in the opening 110.

In the present example embodiment, the base plate 100 may include a metal plate having a sufficient rigidity to support the linear driver 200 and the stopper box 300 with high reliability, and having a sufficient stiffness to minimize potential deformation caused by the load of the linear driver 200 and the stopper box 300. In detail, since the piston rods 240 may be reciprocated, e.g., moved, in the first direction I, the dynamic load and/or vibration of the linear driver 200 may be continuously applied to the base plate 100. In addition, since various impulses may be periodically generated from the stopper box 300 for stopping the movement of the piston rods 240, the periodical impulsive load may be applied to the base plate 100. For those reasons, the base plate 100 may need rigidity and stiffness to sufficiently resist the dynamic loads and vibrations of the linear driver 200 and the impulsive loads of the stopper box 300.

For example, the linear driver 200 may include a fluid actuator having a cylinder, e.g., a pneumatic cylinder or a hydraulic cylinder, and a piston that may be positioned in the cylinder and be connected with the piston rods 240. That is, the linear driver 200 may be actuated by an air pressure or a hydraulic pressure, as will be described in more detail below with reference to FIG. 3.

In the present example embodiment, the linear driver 200 may include the pneumatic actuator. However, a hydraulic actuator may also be used in place of the pneumatic actuator in the linear driver 200, in view of the configurations of the picker assembly and the test handler including the picker assembly.

Figure 3:
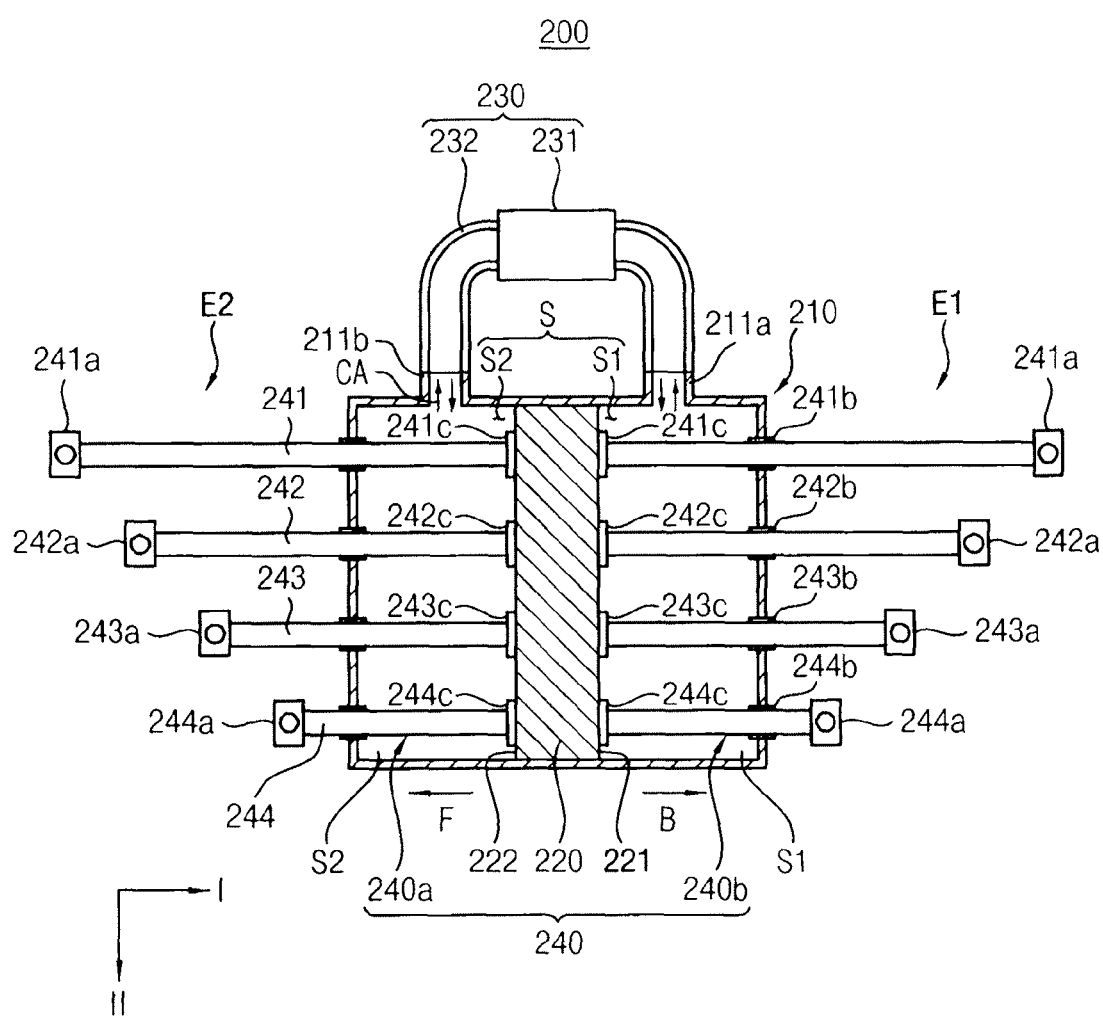
FIG. 3 illustrates a structural view of the linear driver of the pitch control unit shown in FIG. 1.

FIG. 3 is a structural view illustrating the linear driver 200 of the pitch control unit 500.

Referring to FIG. 3, the linear driver 200 may include a cylinder 210 having a closed inner space S into which compressed air CA may flow. The linear driver 200 may further include a piston 220 positioned in the cylinder 210, the piston rods 240 penetrating through the cylinder 210, and a controller 230 controlling the flow of the compressed air CA to thereby move the piston 220 forward or backward in the first direction I. That is, the movement of the piston 220 in a forward direction F or a backward direction B may be controlled by the controller 230 in a medium of the compressed air CA. The inner space S of the cylinder 210 may be divided into a first space S1 and a second space S2 by the piston 220.

A pair of first and second pneumatic ports 211a and 211b may be arranged at an upper portion of the cylinder 210 to correspond to the first and second spaces S1 and S2 of the cylinder 210, respectively, and the compressed air CA may flow into or out of the cylinder 210 through the first and second pneumatic ports 211a and 211b. For example, when the compressed air CA flows into the first space S1 through the first pneumatic port 211a, the compressed air in the second space S2 flows out of the second space S2 through the second pneumatic port 211b, and as a result, the piston 220 moves in the forward direction F (left side of the page). Therefore, the piston rods 240 attached to the piston 220 also move in the forward direction F. In another example, when the compressed air CA flows into the second space S2 through the second pneumatic port 211b, the compressed air CA in the first space S1 flows out of the first space S1 through the first pneumatic port 211a, and as a result, the piston 220 moves in the backward direction B (right side of the page). Therefore, the piston rods 240 attached to the piston 220 also move in the backward direction B.

The compressed air CA may be selectively supplied to one of the first and the second pneumatic ports 211a and 211b by the controller 230. For example, the controller 230 may include a solenoid valve for controlling the flow direction of the compressed air CA. Thus, the controller 230 may control the forward and backward movements of the piston 220 and the piston rods 240.

Since the piston 220 may reciprocate, e.g., move, in the first direction I, the pickers, which may be arranged in series along the first direction I, may also be reciprocated, e.g., moved, in the first direction I. Thus, the forward direction F may be defined as a direction in which the pickers move for a maximal picker pitch, and the backward direction B may be defined as a direction in which the pickers move for a minimal picker pitch. Accordingly, when the piston 220 moves in the forward direction F, the pickers combined, e.g., attached, to the piston rods 240 may be arranged with the maximal picker pitch. Similarly, when the piston 220 moves in the backward direction B, the pickers attached to the piston rods 240 may be arranged with the minimal picker pitch.

The piston 220 may reciprocate along a predetermined stroke in the cylinder 210. For example, the piston 220 may reciprocate the gap distance between the first and the second pneumatic ports 211a and 211b according to the flow direction of the compressed air CA. Thus, the linear driver 200 may include a double acting pneumatic cylinder structure in which the gap distance between the first and the second pneumatic ports 211a and 211b may function as the stroke of the piston 220.

The controller 230 may be provided outside of the cylinder 210 and may include a control body 231 for supplying the compressed air CA and flow lines 232 through which the compressed air CA may flow to the first or the second pneumatic ports 211a and 211b. For example, the control body 231 may include a central processor (not shown) for detecting the current picker state and determining a target picker state, and a solenoid valve (not shown) for changing the flow direction of the compressed air CA. The central processor may generate a control signal for changing the current picker state into the target picker state, and the solenoid valve may be connected to the central processor and may be activated by the control signal.

For example, when the pickers need to be changed from a current state, e.g., a minimal picker pitch, into a target state, e.g., a maximal picker pitch, the controller 230 supplies the compressed air CA into the first space S1 to drive the piston 220 to move in the forward direction F. Similarly, when the pickers need to be changed from a current state having a maximal picker pitch into a target state having a minimal picker pitch, the controller 230 supplies the compressed air CA into the second space S2 to drive the piston 220 to move in the backward direction B. Therefore, the picker pitch of the pickers may be directly controlled by the piston 220 movement in the forward and backward directions F and B.

The piston rods 240 may penetrate through the piston 220. Thus, the piston rods 240 may include forward portions 240a protruding from a second surface 222 of the piston 220 into the second space S2, and backward portions 240b protruding from a first surface 221 of the piston 220 into the first space S1. In the present example embodiment, the piston rods 240 may be secured to the piston 220 in one, e.g., integral and seamless, body. Thus, the piston rods 240 may move linearly along the first direction I together with the piston 220.

For example, as illustrated in FIG. 3, the piston rods 240 may extend to an outside of the cylinder 210, so that both end portions of the piston rods 240 may be positioned at an exterior of the cylinder 210 in the opening 110. As described previously, the piston rods 240 may include first to fourth rods 241 to 244 that may be vertically arranged in the second direction II. Thus, the forward portions 240a of the first to fourth rods 241 to 244 may extend to a second exterior E2 of the cylinder 210, and the backward portions 240b of the first to fourth rods 241 to 244 may extend to a first exterior E1 of the cylinder 210.

The first to fourth rods 241 to 244 may be arranged in vertical series on the piston 220 along the second direction II and may be individually combined to the pickers that may be arranged in horizontal series along the first direction I. For example, four pickers may be combined to the first to fourth rods 241 to 244, respectively, while being arranged in series along the first direction I. Therefore, the number of the rods may be varied according to the number of the pickers, e.g., the number of rods may equal the number of pickers.

The lengths of the first to fourth rods 241 to 244 may decrease or increase in accordance with a position of each rod along the second direction II. In the present example embodiment, the lengths of the first to fourth rods 241 to 244 may decrease along the second direction II, so that the first rod 241 penetrating a highest portion of the piston 220 may be longer along the first direction I than the fourth rod 244 penetrating a lowest portion of the piston 220.

Since the first to fourth pickers attached to respective first to fourth rods may be arranged in a line along the first direction I, the moving distances of each picker may be necessarily different from one another due to an accumulation of the picker pitches. However, the first to fourth rods 241 to 244 may be reciprocated along a single stroke of the piston 220, and thus the moving distances of each picker may be identical to one another. For example the first picker combined to the first rod 241 may move the greatest distance and the fourth picker combined to the fourth rod 244 may move the smallest distance. For those reasons, the first to fourth rods 241 to 244 may be provided to have different lengths in view of the moving distances of each picker between the maximal picker pitch and the minimal picker pitch.

A plurality of buffer members 241a to 244a may be provided at both ends of each piston rod 240, and may absorb the impulsive loads against the stopper box 300. In addition, a plurality of sealing members 241b to 244b may be provided at boundary portions between each piston rod 24o and the cylinder 210, so that the compressed air CA in the inner space S may be sufficiently prevented from leaking from the cylinder 210. Further, a plurality of joint members 241c to 244c may be provided on the first and second surfaces 221 and 222 of the piston 220, and thus, the rods 241 to 244 may be movably secured to the piston 220 with high reliability.

While the present example embodiment discloses that each piston rod 240 penetrate through the piston 220 as a single member and, thus, the forward portion 240a and the backward portion 240b may be integral with each other to define the piston rod 240 as a single continuous body, embodiments are not limited thereto. For example, individual rod members may be attached separately to the first and second surfaces 221 and 222 of the piston 220, respectively, so that forward rods may be individually provided with the piston 220 separately from backward rods.

Referring to FIGS. 1-2B, the stopper box 300 may individually stop the forward movement or the backward movement of each rod 241 to 244 in such a way that the moving distances of each rod 241 to 244 may be different from one another. For example, the stopper box 300 may include a forward stopper box 310 for stopping forward movements of the piston rods 240, and a backward stopper box 320 for stopping backward movements of the piston rod 240. In the present example embodiment, the forward stopper box 310 may stop the forward movements of the rods 241 to 244 individually, and the backward stopper box 320 may stop the backward movements of the rods 241 to 244 individually.

For example, the stopper box 300 may include a stopper body having configurations and materials sufficiently resisting the impulsive loads against the piston rods 240, and a buffer pad that may be selectively combined to the stopper body for absorbing the impulsive loads applied to the stopper body. The forward and backward stopper boxes 310 and 320 may have substantially the same structures, and thus detailed descriptions of the stopper box 300 will be disclosed exemplarily with respect to the forward stopper box 310 hereinafter.

Figure 4:
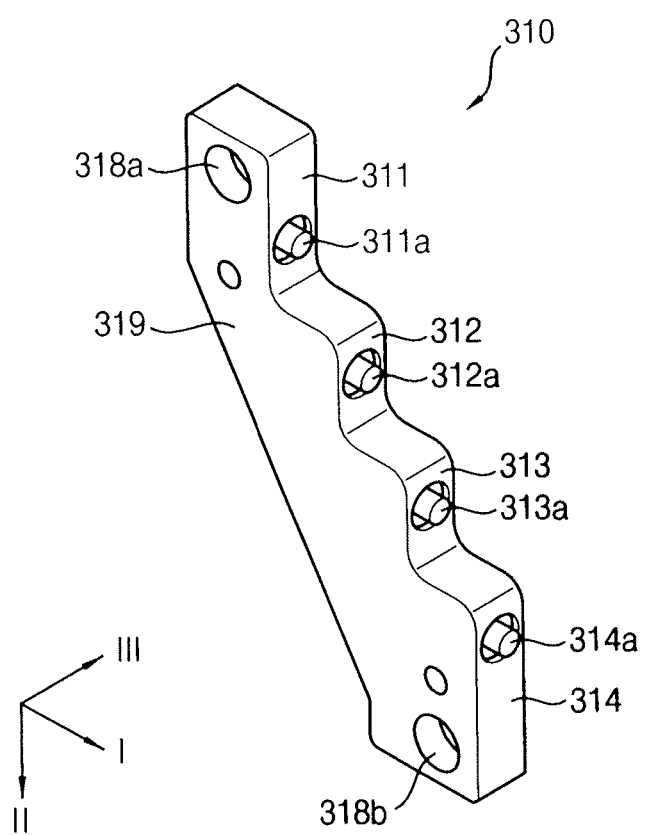
FIG. 4 illustrates a perspective view of a forward stopper box of the pitch control unit shown in FIG. 1.

FIG. 4 is a perspective view illustrating the forward stopper box 310 of the pitch control unit 500.

Referring to FIG. 4, the forward stopper box 310 may include first to fourth stopper bodies 311 to 314 that may face the first to fourth rods 241 to 244 of the forward portion 240a of the piston rod 240, respectively, and may be positioned on the moving path of the corresponding first to fourth rods 241 to 244. Thus, the first to fourth rods 241 to 244 moving forward in the first direction I may collide with the first to fourth stopper bodies 311 to 314, respectively, and may be stopped at the position where the corresponding stopper bodies 311 to 314 are located. That is, the first to fourth stopper bodies 311 to 314 may prevent the first to fourth rods 241 to 244 from moving further in the forward direction F. In detail, first to fourth buffer pads 311a and 314a may be provided with the first to fourth stopper bodies 311 to 314, respectively, in correspondence with the buffer members 241a to 244a of the rods 241 to 244, respectively. Thus, the impulsive loads of each rod may be absorbed into the corresponding buffer pad.

In the present example embodiment, the first stopper body 311 may be positioned on the moving path of the first rod 241 having a first length, i.e., the largest length among the first to fourth rods 241 to 244, and may be farthest off from the cylinder 210 in view of the first length of the first rod 241. The second stopper body 312 may be positioned on the moving path of the second rod 242 having a second length smaller than the first length of the first rod 241, and may be closer to the cylinder 210 than the first stopper body 311 in view of the second length of the second rod 242. In the same way, the third stopper body 313 may be positioned on the moving path of the third rod 243 having a third length smaller than the second length of the second rod 242, and may be closer to the cylinder 210 than the second stopper body 312 in view of the third length of the third rod 243. Finally, the fourth stopper body 314 positioned on the moving path of the fourth rod 244 having a fourth length, i.e., the smallest length among the rods 241 to 244, may be closest to the cylinder 210. Thus, a gap space between the cylinder 210 and each of the first to fourth stopper bodies 311 to 314 in the opening 110 may be reduced in a downward direction of the second direction II.

Therefore, when the piston 220 moves forward by a unit stroke, the first rod 241 may move in the forward direction F a first forward distance FD1 (FIG. 2A) at which the first stopper body 311 may stop the first rod 241. In the same unit stroke of the piston 220, the second rod 242 may travel a second forward distance FD2 smaller than the first forward distance FD1 and at which the second stopper body 312 may stop the second rod 242, and the third rod 243 may travel a third forward distance FD3 smaller than the second forward distance FD2 and at which the third stopper body 313 may stop the third rod 243. In the same way, the fourth rod 244 may travel a fourth forward distance FD4 smaller than the third forward distance FD3 and at which the fourth stopper body 314 may stop the fourth rod 244. That is, the forward stopper box 310 may stop the first to fourth rods 241 to 244 at different positions and thus the rods 241 to 244 may have different forward distances.

The first to fourth stopper bodies 311 to 314 may have various configurations and structures as long as the stopper bodies 311 to 341 may sufficiently resist the impulsive loads against the corresponding rods 241 to 244 and may stop the corresponding rods. For example, the first to fourth stopper bodies 311 to 314 may be individually, e.g., separately from each other, positioned on the moving path of the respective first to fourth rods 241 to 244. In another example, the first to fourth stopper bodies 311 to 314 may be formed into a single cascade block positioned to face the linear driver 200 in such a configuration that the first to fourth stopper bodies 311 to 314 may be positioned on the moving path of the corresponding first to fourth rods 241 to 244. In the present embodiment, as illustrated in FIG. 4, the first to fourth stopper bodies 311 to 314 may be arranged in a stepped shape corresponding to positions of the corresponding first to fourth rods 241 to 244, and may constitute a single stopper block 319 having the stepped shape. The stopper block 319 may be combined to the base plate 100 by using a pair of bolt members 318a and 318b.

Like the forward stopper box 310, the backward stopper box 320 may include first to fourth stopper bodies that may face the first to fourth rods 241 to 244 of the backward portion 240b of the piston rod 240, respectively, and may be positioned on the moving path of the corresponding first to fourth rods 241 to 244. Thus, the first to fourth rods 241 to 244 moving backward in the first direction I may collide with the first to fourth stopper bodies, respectively, and may be stopped at the position where the corresponding first to fourth stopper bodies are located. The backward movement of the piston rods 240 may be interrupted by the backward stopper box 320.

Therefore, when the piston 220 moves backward by a unit stroke, the first rod 241 may move in the backward direction B a first backward distance BD1 (FIG. 2A) at which the first stopper body of the backward stopper box 320 may stop the first rod 241. In the same unit stroke of the piston 220, the second rod 242 may travel a second backward distance BD2 smaller than the first backward distance BD1 and at which the second stopper body may stop the second rod 242, and the third rod 243 may travel a third backward distance BD3 smaller than the second backward distance BD2 and at which the third stopper body may stop the third rod 243. In the same way, the fourth rod 244 may travel a fourth backward distance BD4 smaller than the third backward distance BD3 and at which the fourth stopper body may stop the fourth rod 244. That is, the backward stopper box 320 may stop the first to fourth rods 241 to 244 of the backward portion 240b at different positions and, thus, the first to fourth rods 241 to 244 may have different backward distances.

In the present example embodiment, the forward and backward stopper boxes 310 and 320 may be symmetrically arranged with respect to the cylinder 210. Thus, the first to fourth forward distances FD1 to FD4 may be substantially identical to the first to fourth backward distances BD1 to BD4, respectively. In addition, since the piston rods 240 may reciprocate with the piston 210, i.e., repeatedly move forward and backward by a stroke, each of the forward distances FD1 to FD4 and the backward distances BD1 to BD4 may be repeated as the reciprocating distance of each rod when the pitch control unit 500 is operated.

Since the pickers may be attached to the piston rods 240. e.g., first to fourth rods 241 to 244, respectively, the pickers may be arranged in the forward direction F according to the forward distances FD1 to FD4, or may be arranged in the backward direction B according to the backward distances BD1 to BD4. Therefore, when the piston 220 moves in the forward direction F, the pickers may individually travel the first to fourth forward distances FD1 to FD4 and, thus, may be maximally spaced apart from each other by a maximal picker pitch. Similarly, when the piston 220 moves in the backward direction B, the pickers may individually travel the first to fourth backward distances BD1 to BD4 and, thus, may be minimally spaced apart from each other by a minimal picker pitch. That is, the picker may be arranged by the maximal picker pitch when moving forward and by the minimal picker pitch when moving backward.

The picker holder 400 may be connected to both the pickers and the piston rods 240 through the opening 110. The picker holder 400 may be attached to the linear driver 200 in such a configuration that the first to fourth rods 241 to 244 may be individually combined to the pickers that may be arranged in the first direction I, and may pick objects, e.g., semiconductor packages, so that the picker pitch, i.e., a gap distance between neighboring pickers, may be controlled by the reciprocating distance of each rod.

Figure 5A:
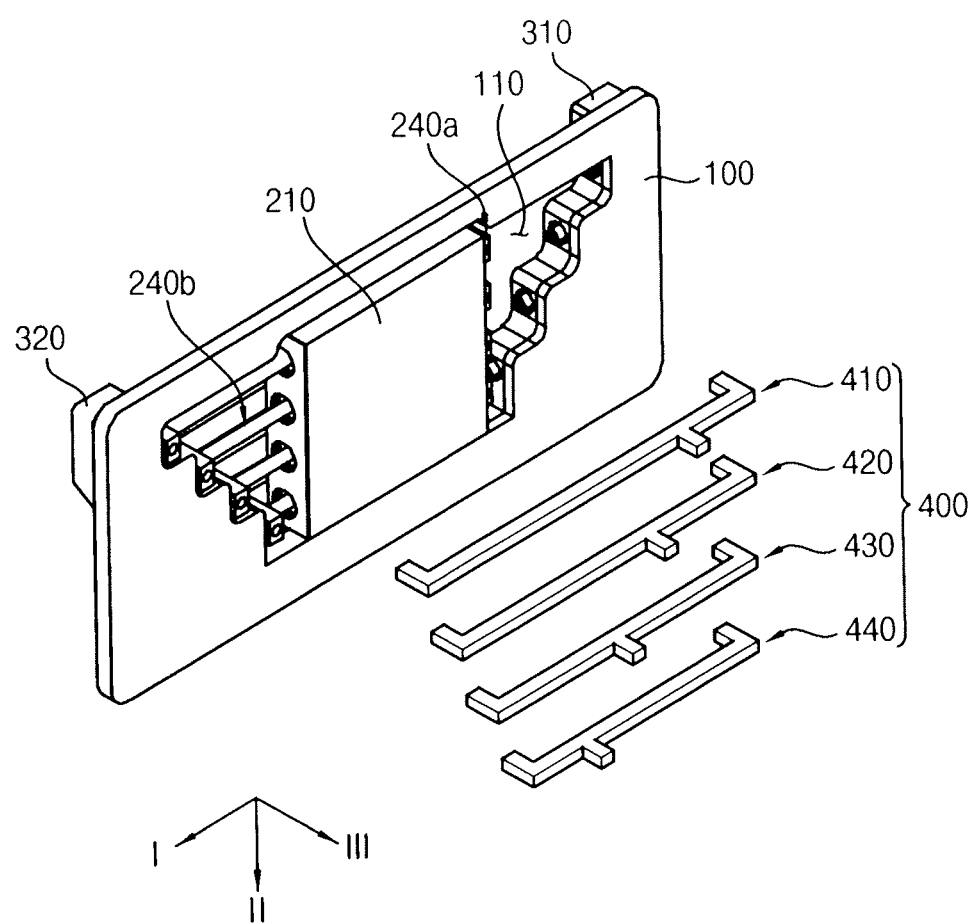
FIG. 5A illustrates an exploded perspective view of the picker holder and the piston rod of the pitch control unit shown in FIG. 1.
Figure 5B:
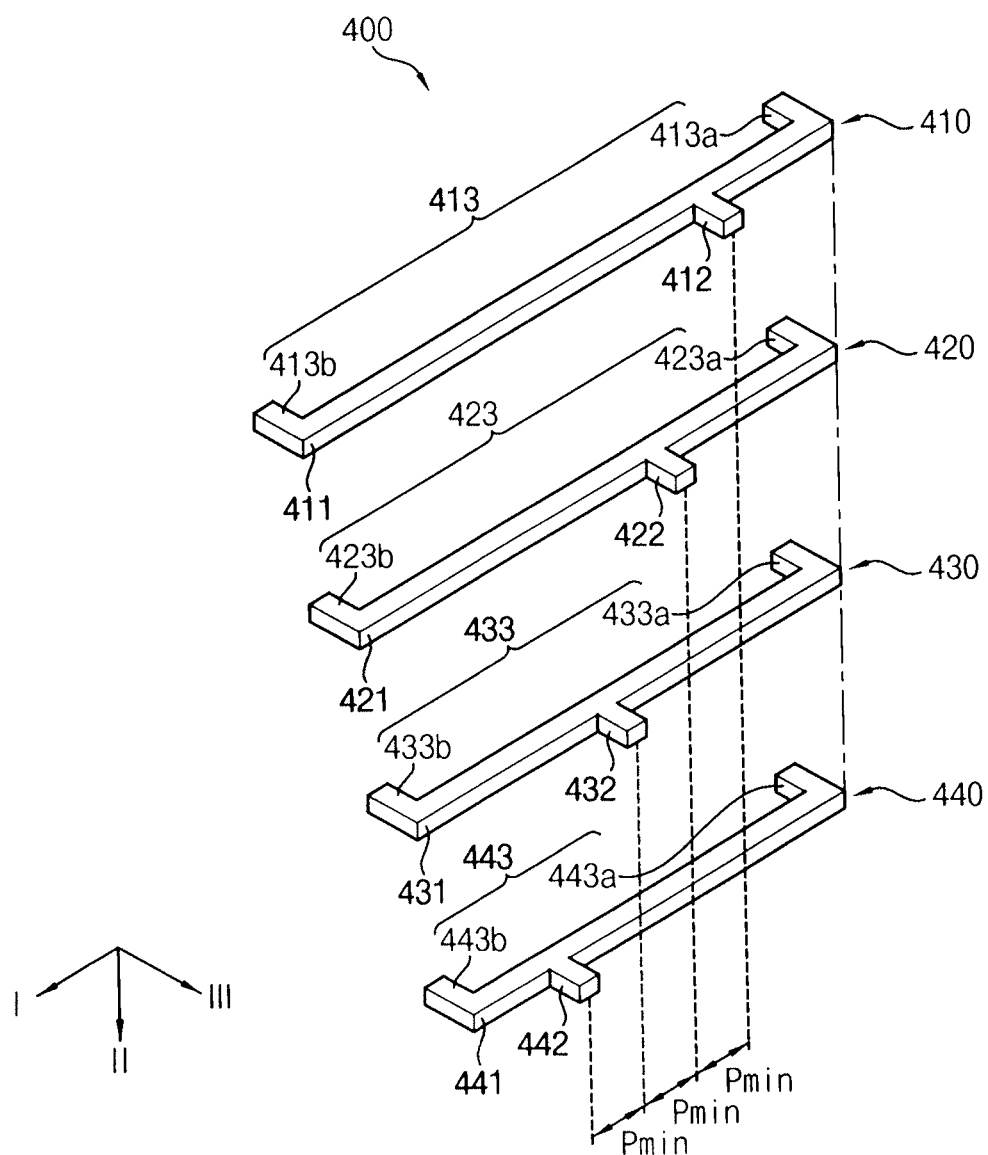
FIG. 5B illustrates a perspective view of an arrangement of the picker holder when a backward stopper box makes contact with a piston rod.

FIG. 5A is an explosive perspective view illustrating the picker holder 400 and the piston rods 240 of the pitch control unit 500. FIG. 5B is a perspective view illustrating the arrangement of the picker holder 400 when the backward stopper box 320 makes contact with the piston rods 240, and FIG. 5C is a perspective view illustrating the arrangement of the picker holder 400 when the forward stopper box 310 makes contact with the piston rods 240.

Figure 5C:
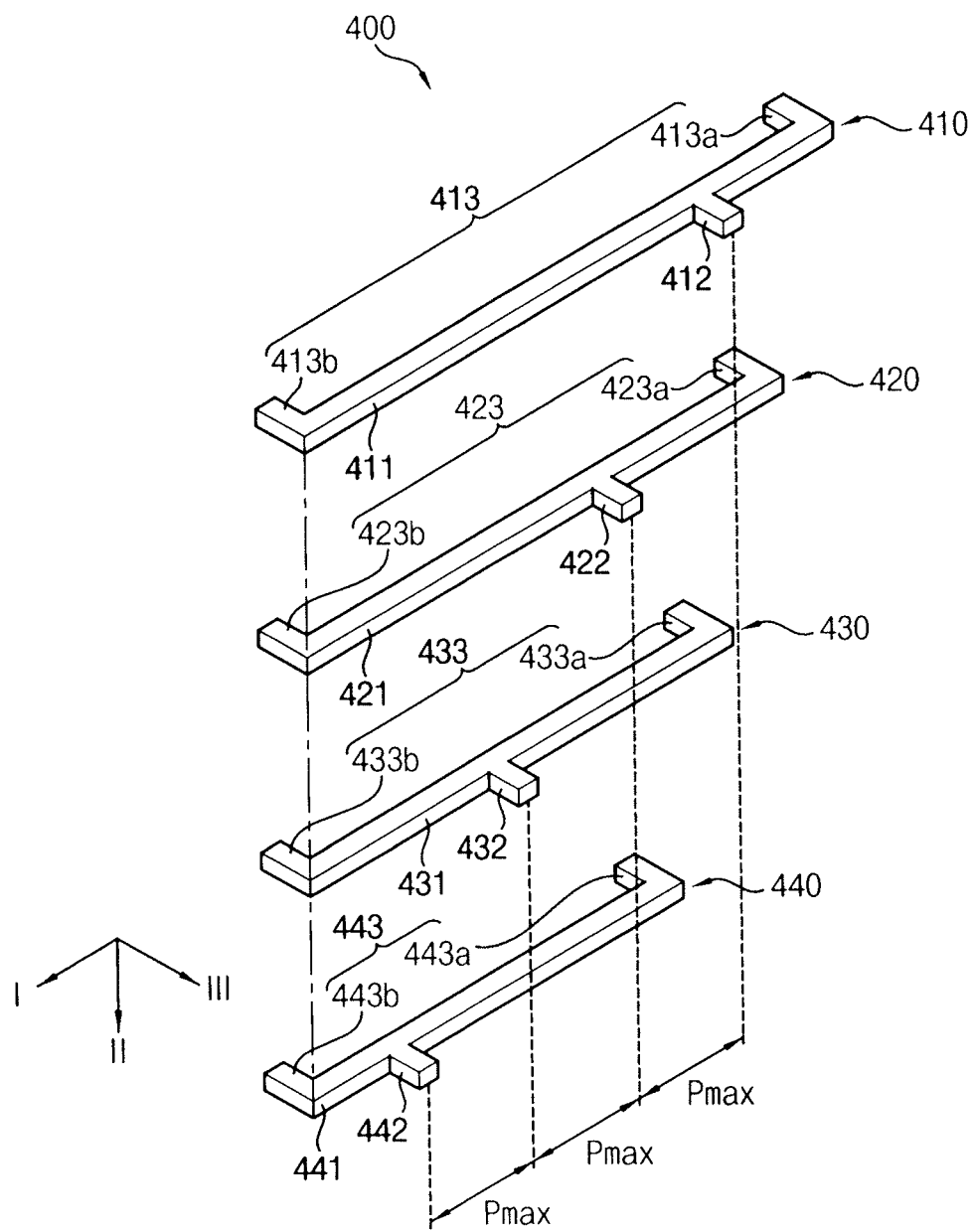
FIG. 5C illustrates a perspective view of an arrangement of the picker holder when a forward stopper box makes contact with a piston rod.

Referring to FIGS. 5A to 5C, the picker holder 400 may include a plurality of holders. e.g., first to fourth holders 410 to 440, corresponding to the piston rods 240, e.g., first to fourth rods 241 to 244, by one to one. e.g., the number of the holders in the picker holder 400 may equal the number of the piston rods 240. Each of the holders 410 to 440 may include a slim, e.g., slender, body extending in the first direction I, a picker connector protruding from the slim body and connected to the picker, and a rod connector protruding from the slim body and connected to the rod through the opening 110. Referring to FIG. 5B, the slim, e.g., thin, bodies of the first to fourth holders 410 to 440 are denoted as reference numerals 411 to 441, and the picker connectors of the first to fourth holders 410 to 440 are denoted as reference numerals 412 to 442. The rod connectors of the first to fourth holders 410 to 440 are denoted as reference numerals 413 to 443.

Each of the slim bodies 411 to 441 may be shaped into a slim, e.g., and linear, member extending along the first direction I, and each rod connector 413 to 443 may include a pair of forward and backward rod joints 413a to 443b that may protrude from both end portions of the slim member. Thus, the slim bodies 411 to 441 may be attached to the corresponding rods 241 to 244 at both of the forward rod portion 240a and the backward rod portion 240b of the piston rod 240.

In detail, the first holder 410 may include the first slim body 411 that may have a sufficient length for the first forward and backward distances FD1 and BD1, e.g., the length of the first slim body 411 may equal a sum of a length of the first forward distance FD1 and a length of the cylinder 210 along the first direction I, and may be attached to the first rod 241. A pair of first forward and backward rod joints 413a and 413b may be provided at opposite end portions of the first slim body 411, and may penetrate through the opening 110. The first forward rod joint 413a may be connected to the forward rod portion 240a of the first rod 241, and the first backward rod joint 413b may be connected to the backward rod portion 240b of the first rod 241. Thus, the first forward rod joint 413a may repeatedly travel. e.g., move along, the first forward distance FD1, and the first backward rod joint 413b may repeatedly travel, e.g., move along, the first backward distance BD1. The first picker connector 412 may protrude from the first slim body 411 in a direction opposite to the first rod connector 413, and may be connected to a first picker. The first picker may be solely attached to the first rod 241 by the first holder 410, and thus, the movement of the first rod 241 along the first direction I may directly cause the movement of the first picker. That is, the first picker may be directly controlled by the first rod 241.

The second holder 420 may be positioned under the first holder 410, and may be attached to the second rod 242 that may be positioned under the first rod 241. The second slim body 421 of the second holder 420 may have a sufficient length for the second forward and backward distances FD2 and BD2, so that the length of the second slim body 421 may be shorter than that of the first slim body 411. A pair of second forward and backward rod joints 423a and 423b may be provided at opposite end portions of the second slim body 421, and may penetrate through the opening 110. The second forward rod joint 423a may be connected to the second rod 242 of the forward rod portion 240a and the second backward rod joint 423b may be connected to the second rod 242 of the backward rod portion 240b. Thus, the second forward rod joint 423a may repeatedly travel the second forward distance FD2, and the second backward rod joint 423b may repeatedly travel the second backward distance BD2. The second picker connector 422 may protrude from the second slim body 421 in a direction opposite to the second rod connector 423, and may be connected to a second picker. The second picker may be solely combined to the second rod 242 by the second holder 420, and thus the movement of the second rod 242 may directly cause the movement of the second picker. That is, the second picker may be directly controlled by the second rod 242.

In the same way, the third holder 430 may be positioned under the second holder 420, and may be attached to the third rod 243 that may be positioned under the second rod 242. The third slim body 431 of the third holder 430 may have a sufficient length for the third forward and backward distances FD3 and BD3, so that the length of the third slim body 431 may be shorter than that of the second slim body 421. A pair of third forward and backward rod joints 433a and 433b may be provided at opposite end portions of the third slim body 431, and may penetrate through the opening 110. The third forward rod joint 433a may be connected to the third rod 243 of the forward rod portion 240a and the third backward rod joint 433b may be connected to the third rod 243 of the backward rod portion 240b. Thus, the third forward rod joint 433a may repeatedly travel the third forward distance FD3, and the third backward rod joint 433b may repeatedly travel the third backward distance BD3. The third picker connector 432 may protrude from the third slim body 431 in a direction opposite to the third rod connector 433, and may be connected to a third picker. The third picker may be solely combined to the third rod 243 by the third holder 430, and thus the movement of the third rod 243 may directly cause the movement of the third picker. That is, the third picker may be directly controlled by the third rod 243.

The fourth holder 440 may be positioned under the third holder 430 and may be combined to the fourth rod 244 that may be positioned under the third rod 243. The fourth slim body 441 of the fourth holder 440 may have a sufficient length for the fourth forward and backward distances FD4 and BD4, so that the length of the fourth slim body 441 may be shorter than that of the third slim body 431. A pair of fourth forward and backward rod joints 443a and 443b may be provided at opposite end portions of the fourth slim body 441 and may penetrate through the opening 110. The fourth forward rod joint 443a may be connected to the fourth rod 244 of the forward rod portion 240a, and the fourth backward rod joint 443b may be connected to the fourth rod 244 of the backward rod portion 240b. Thus, the fourth forward rod joint 443a may repeatedly travel the fourth forward distance FD4 and the fourth backward rod joint 443b may repeatedly travel the fourth backward distance BD4. The fourth picker connector 442 may protrude from the fourth slim body 441 in a direction opposite to the fourth rod connector 443 and may be connected to a fourth picker. The fourth picker may be solely attached to the fourth rod 244 by the fourth holder 440, and thus the movement of the fourth rod 244 may directly cause the movement of the fourth picker. That is, the fourth picker may be directly controlled by the fourth rod 244.

In detail, as illustrated in FIGS. 2A and 5B, when the first to fourth holders 410 to 440 travel, e.g., move along, the first to fourth backward distances BD1 to BD4, respectively, and the piston rods 240 contact the backward stopper box 320 (FIG. 2A), the first to fourth holders 410 to 440 shift toward the backward stopper box 320. In this case, the first to fourth forward rod joints 413a to 443a may be arranged, e.g., aligned, into a vertical line along the second direction II (dot-dashed lined in FIG. 5B) adjacent to the cylinder 210 in the second exterior E2 of the cylinder 210 (behind the structure illustrated in FIG. 2A), and the first to fourth backward rod joints 413b to 443b may be arranged into a downward-step along the second direction II in the first exterior E1 of the cylinder 210.

In such configurations, as illustrated in FIG. 5B, the first to fourth picker connectors 412 to 442 may be arranged in a line along the first direction I, and may be uniformly spaced apart from each other by a minimal gap distance Pmin. As a result, the first to fourth pickers, which may be attached to the first to fourth picker connectors 412 to 442, respectively, may also be arranged in the first direction I with the minimal gap distance Pmin. The first to fourth pickers may be spaced apart from each other by the uniform gap distance corresponding to the minimal gap distance Pmin, and thus the minimal gap distance Pmin may function as a minimal picker pitch of the pickers.

When the first to fourth rods 241 to 244 move forward in the first direction I by changing the flow direction of the compressed air CA to thereby make contact with the forward stopper box 310, the first to fourth picker connectors 412 to 442 may be spaced apart from each other by a maximal gap distance Pmax. That is, referring to FIG. 5C, when the first to fourth holders 410 to 440 travel, e.g., move along, the first to fourth forward distances FD1 to FD4, respectively, and the picker holder 400 makes contact with the forward stopper box 310, the first to fourth backward rod joints 413b to 443b may be arranged into a vertical line along the second direction II adjacent to the cylinder 210 in the first exterior E1 of the cylinder 210, and the first to fourth forward rod joints 413a to 443a may be arranged into a downward-step along the second direction II in the second exterior E2 of the cylinder 210.

In such configurations, the first to fourth picker connectors 412 to 442 may be arranged in a line along the first direction I and may be uniformly spaced apart from each other by a maximal gap distance Pmax. As a result, the first to fourth pickers may also be arranged in the first direction I with the maximal gap distance Pmax. The first to fourth pickers may be spaced apart from each other by the uniform gap distance corresponding to the maximal gap distance Pmax, and thus the maximal gap distance Pmax may function as a maximal picker pitch of the pickers.

Figure 6:
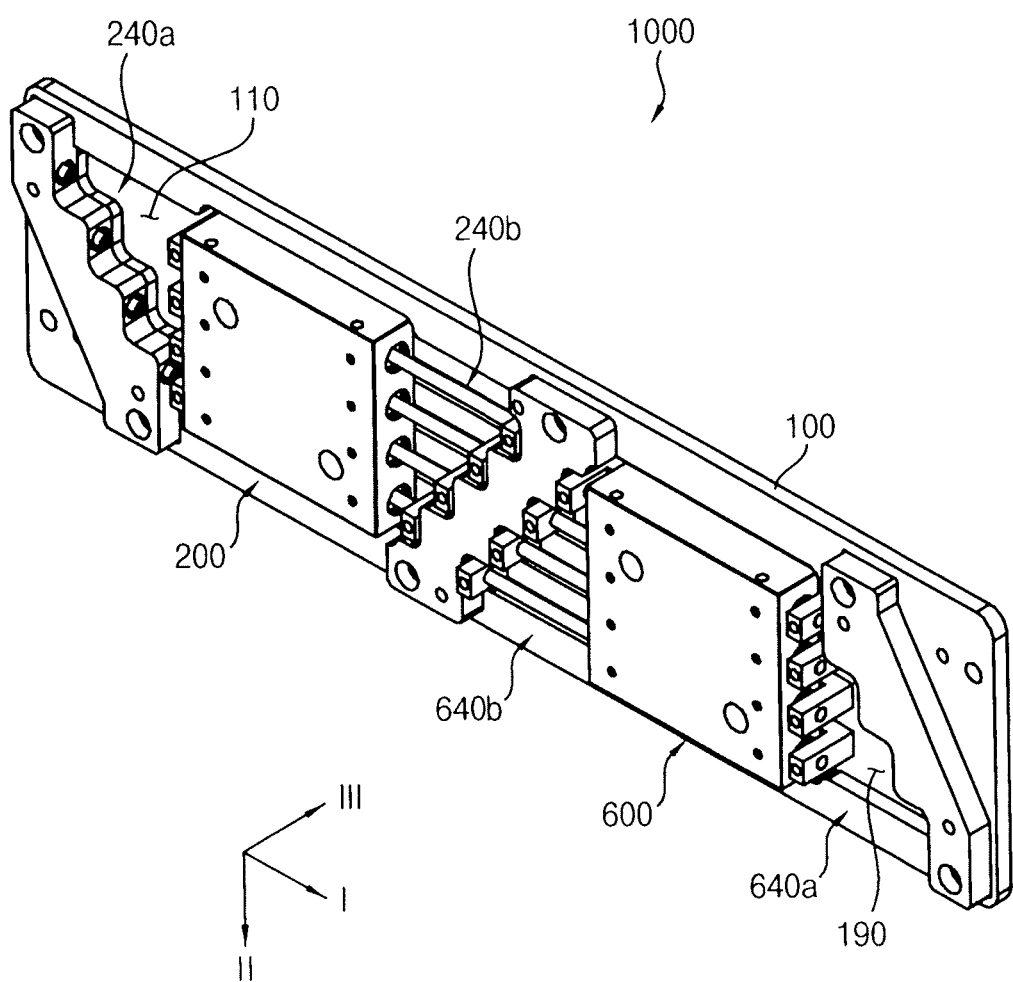
FIG. 6 illustrates a perspective view of a pitch control unit for a picker assembly of a test handler in accordance with another exemplary embodiment.
Figure 7B:
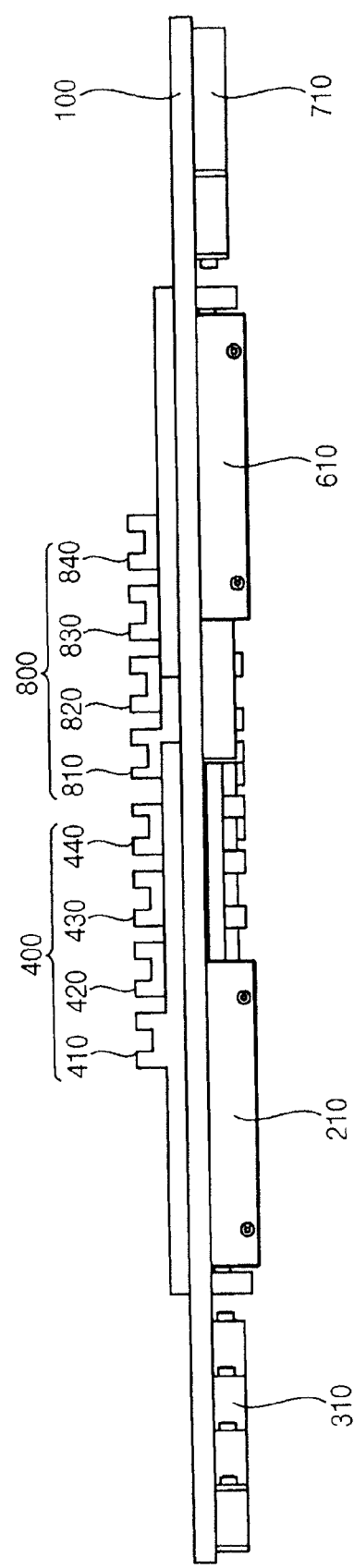
FIG. 7B illustrates a top plan view of the pitch control unit shown in FIG. 6.

FIG. 6 is a perspective view illustrating a pitch control unit for a picker assembly of a test handler in accordance with another exemplary embodiment. FIG. 7A is a front view illustrating the pitch control unit shown in FIG. 6, and FIG. 7B is a plan view illustrating the pitch control unit shown in FIG. 6.

A pitch control unit 1000 disclosed with reference to FIG. 6 has substantially the same structures and configurations as the pitch control unit 500 disclosed with reference to FIG. 1, except for an additional linear driver and an additional stopper box. Thus, in FIG. 6, the same reference numerals denote the same elements as in FIG. 1, and any detailed descriptions of the same elements will be omitted.

Referring to FIGS. 6, 7A, and 7B, the pitch control unit 1000 in accordance with another exemplary embodiment may include the base plate 110 having an additional opening 190 adjacent to the opening 110, and thus a pair of the openings 110 and 190 may be provided with the base plate 100. An additional linear driver 600 including additional rods 640, an additional stopper box 700 for stopping the linear movement of the additional rods 640, and an additional pick holder 800 for connecting the additional rods 640 and additional pickers. Thus, the pitch control unit 1000 may be combined with more pickers than the pitch control unit 500 shown in FIG. 1.

In the present example embodiment, the additional linear driver 600, the additional stopper box 700, and the additional pick holder 800 may be reversely axisymmetric to the linear driver 200, the stopper box 300, and the pick holder 400, respectively, with respect to a central axis of the base plate 100 that may extend along the third direction III. Thus, the backward rod portion 240b of the linear driver 200 may be arranged adjacent to a backward rod portion 640b of the additional linear driver 600 around a central portion of the base plate 100, and the forward rod portion 240a of the linear driver 200 and a forward rod portion 640a of the additional linear driver 600 may be arranged at opposite end portion of the base plate 100, respectively. In addition, the additional stopper box 700 may include a pair of forward and backward stopper boxes 710 and 720 that may constitute stepped structures decreasing upward on the base plate 100 while the stopper box 300 may include a pair of forward and backward stopper boxes 310 and 320 that may constitute stepped structures decreasing downward on the base plate 100.

In detail, as illustrated in FIG. 7A, the forward stopper box 310 and the additional forward stopper box 710 may be separately positioned at opposite end portions of the base plate 100 as individual single cascade blocks. However, the backward stopper box 320 and the additional backward stopper box 720 may be positioned adjacent to each other at a central portion of the base plate 100, and may be merged into a single merge block 790. Therefore, the stepped structures of the backward stopper box 320 and the additional backward stopper box 720 may be arranged at both side portions of the single merge block 790 that may be formed into a double cascade block. The additional forward stopper box 710 may stop the forward movement of the additional piston rods 640 as described previously with reference to the forward stopper box 310 and the piston rods 240, so that the piston rods 240 and the additional piston rods 640 may travel corresponding forward distances. In the same way, the additional backward stopper box 720 may stop the backward movement of the additional piston rods 640 as described previously with reference to the backward stopper box 320 and the piston rods 240, so that the piston rods 240 and the additional piston rods 640 may travel corresponding backward distances.

In the present example embodiment, the additional piston rods 640 may include four rods, e.g., like the piston rods 240 having first to fourth rods 241 to 244. Thus, the additional piston rods 640 may include fifth to eighth rods 641 to 644 that may be arranged along the second direction II. Since the additional linear driver 600 may be arranged reversely to the linear driver 200, the eighth rod 644 may have the largest length. i.e., in correspondence to the first rod 241, and the fifth rod 641 may have the smallest length. i.e., in correspondence to the fourth rod 244.

The backward rod portion of the fifth to eighth rods 641 to 644 may travel fifth to eighth backward distances BD5 to BD8 in the backward direction B, respectively, and the forward rod portion of the fifth to eighth rods 641 to 644 may travel fifth to eighth forward distances FD5 to FD8 in the forward direction F, respectively.

The additional picker holder 800 may also include a plurality of holders like the picker holder 400, e.g., fifth to eighth holders 810 to 840, that may be arranged along the second direction II. The fifth to eighths holders 810 to 840 may be combined to the fifth to eighth rods 641 to 644, respectively, so that the eighth holder 840 may have the largest length, and the fifth holder 810 may have the smallest length. Like the first to fourth holders 410 to 440, each of the fifth to eighth holders 810 to 840 may include a slim body, a picker connector, and a rod connector having a pair of forward and backward rod joints.

In such configurations, first to fourth pickers may be combined to the first to fourth holders 410 to 440, and may be arranged in a line along the first direction I, and fifth to eighth pickers may be combined to the fifth to eighth holders 810 to 840 and may be arranged in a line along the first direction I. Thus, first to eighth pickers may be connected to the first to eighth rods 241 to 244 and 641 to 644 via the picker holder 400 and the additional picker holder 800 in a line along the first direction I. The first to fourth pickers may move forward from a central portion to a left portion of the base plate 100, and move backward from the left portion to the central portion of the base plate 100 while the moving distances of the first to fourth pickers may decrease downward along the second direction II. The fifth to eighth pickers may move forward from a central portion to a right portion of the base plate 100 and move backward from the right portion to the central portion of the base plate 100 while the moving distances of the fifth to eighth pickers may increase downward along the second direction II.

Therefore, the fourth picker connector 442 of the fourth hold 440, which may be combined to the fourth rod 244, and the fifth picker connector of the fifth hold 810, which may be combined to the fifth rod 641, may be positioned adjacent to each other at the central portion of the base plate 100. In the same way, the first picker connector 412 of the first hold 410, which may be combined to the first rod 241, and the eighth picker connector of the eighth hold 840, which may be combined to the eighth rod 644, may be positioned separately from each other at the end portions of the base plate 100. In the present example embodiment, the fourth picker connector 442 and the fifth picker connector may be positioned on both sides of the same merge block 790.

Therefore, when the piston rod 240 may make contact with the backward stopper box 320 and the additional piston rods 640 may make contact with the additional backward stopper box 720, the first to eighth pickers may be arranged at the minimal picker pitch Pmin. When the piston rod 240 may make contact with the forward stopper box 310 and the additional piston rod 640 may make contact with the additional forward stopper box 710, the first to eighth pickers may be arranged at the maximal picker pitch Pmax.

The first to fourth holders 410 to 440 may be arranged at the maximal picker pitch Pmax or at the minimal picker pitch Pmin by moving the piston rod 240 as described above with reference to FIGS. 5A to 5C. In the same way, the fifth to eighth pickers may also be arranged at the maximal picker pitch Pmax or at the minimal picker pitch Pmin by moving the additional piston rods 640.

In the present example embodiment, the linear driver 200 and the additional linear driver 600 may include a double acting pneumatic cylinder structure, and thus the air flow of the compressed air in the additional cylinder 610 may be easily changed by the solenoid valve of the controller 230.

Accordingly, the pitch control unit 1000 may include a linear driver that may be directly combined with the pickers without any intermediate driving members. Therefore, the pickers may be directly arranged by the linear driver, and the picker pitch of the pickers may be accurately and directly controlled by the linear driver.

Figure 8:
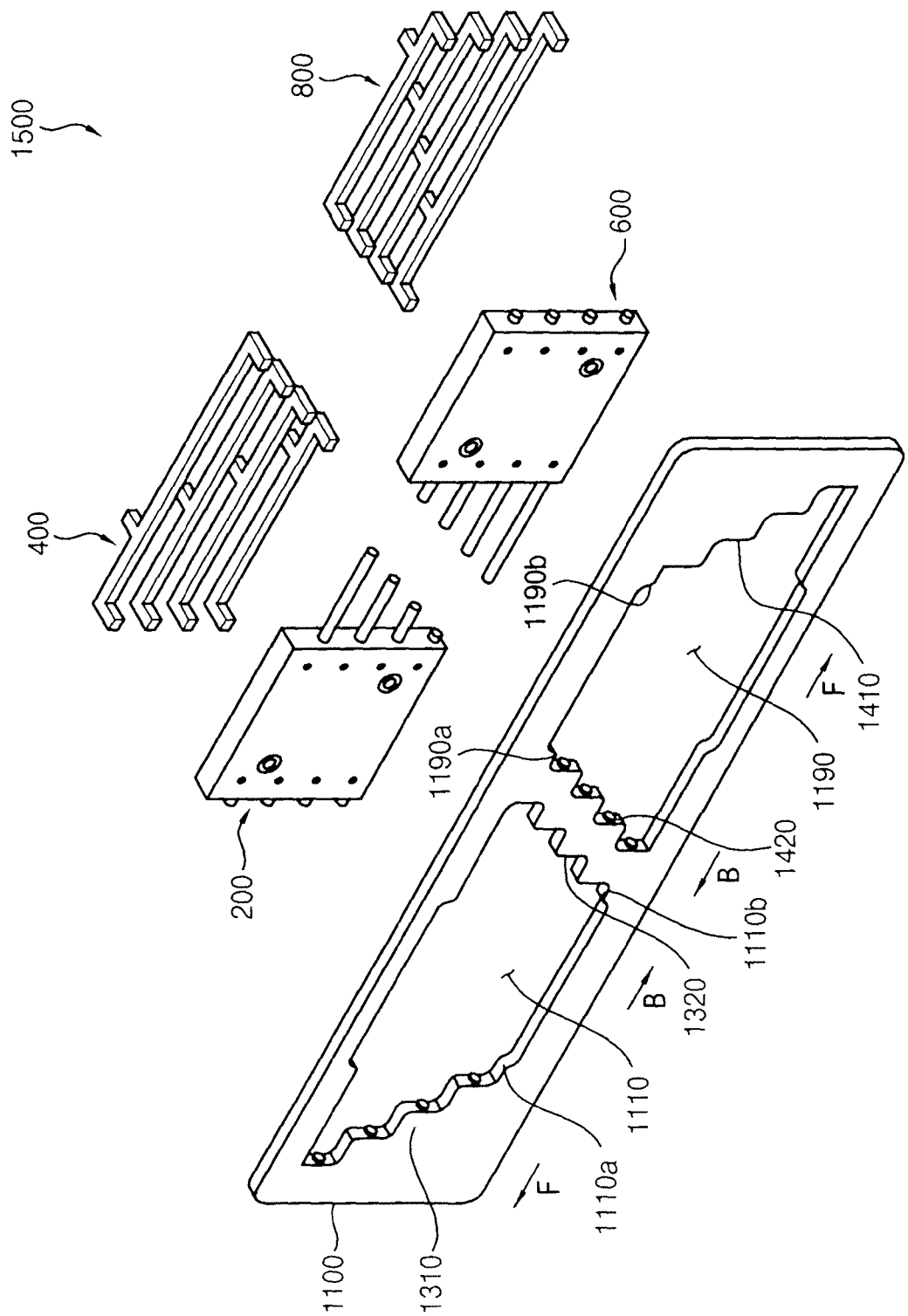
FIG. 8 illustrates an exploded perspective view of a pitch control unit for a picker assembly of a test handler in accordance with still another exemplary embodiment.

FIG. 8 is an explosive perspective view illustrating a pitch control unit for a picker assembly of a test handler in accordance with still another exemplary embodiment. The pitch control unit shown in FIG. 8 has substantially the same structure as the pitch control unit shown in FIG. 6, except that the stopper box 300 and the additional stopper box 700 may be integrally provided with the base plate 100 in one body. Hereinafter, the base plate integrated with the stopper box 300 and the additional stopper box 700 will be referred to as base frame that may be denoted by reference numeral 1100 in FIG. 8. The linear drivers and the picker holders in FIG. 8 may be denoted as the same reference numerals 200,400,600 and 800 of FIG. 6.

Referring to FIG. 8, a pitch control unit 1500 in accordance with still another exemplary embodiment may include the base frame 1100 having first and second openings 1110 and 1190 that may have the same size and shape as the opening 110 and the additional opening 190 of the base plate 100 shown in FIG. 6. Thus, the linear driver 200 and the additional linear driver 600 may be positioned in the first and the second openings 1110 and 11190, respectively, and the piston rods 240 and the additional piston rods 640 may also be reciprocated along the forward distances and backward distances in the first and second openings 1110 and 1190.

A first forward stopper 1310 may be provided at a first side 1110a of the first opening 1110, and a first backward stopper 1320 may be provided at a second side 1110b of the first opening 1110 that may be opposite to the first side 1110a along the first direction I. In addition, a second forward stopper 1410 may be provided at a second side 1190b of the second opening 1190, and a second backward stopper 1420 may be provided at a first side 1190a of the second opening 1190 that may be opposite to the second side 1190b along the first direction I.

In detail, the first and the second forward stoppers 1310 and 1410 may be provided reversely to each other at both end portions of the base frame 1100, while the first and the second forward stoppers 1310 and 1410 may be provided in reverse to each other at a central portion of the base frame 1100. Thus, the first opening 1110 and the first forward and backward stoppers 1310 and 1320 may be shaped into a trapezoid and the second opening 1190 and the second forward and backward stoppers 1410 and 1420 may be shaped into a reverse trapezoid.

The linear driver 200 may be positioned in the first opening 1110 in such a way that the movement of the piston rods 240 including the first to fourth rods 241 to 244 may be individually stopped by the first forward and backward stoppers 1310 and 1320. In addition, the additional linear driver 600 may be positioned in the second opening 1190 in such a way that the movement of the additional piston rods 640 including the fifth to eighths rods 641 to 644 may be individually stopped by the second forward and backward stoppers 1410 and 1420.

The linear driver 200 may be positioned at a central portion of the first opening 1110, and the picker holder 400 may be directly combined to the piston rods 240 of the linear driver 200. Thus, the first to fourth holders 410 to 440 of the picker holder 400 may travel the first to fourth forward distances FD1 to FD4 in the forward direction F, respectively, or the first to fourth backward distances BD1 to BD4 in the backward direction B, respectively, according to the forward and backward movement of the first to fourth rods 241 to 244. Since the pickers may be individually combined to the respective holder 410 to 440, the picker pitch of the pickers may be directly controlled by the linear driver 200. In the same way, the additional linear driver 600 may be positioned at a central portion of the second opening 1190, and the additional picker holder 800 may be directly combined to the additional piston rods 640 of the additional linear driver 600. Thus, the fifth to eighth additional holders 810 to 840 of the additional picker holder 800 may travel the fifth to eighth forward distances FD5 to FD8 in the forward direction F, respectively, or the fifth to eighth backward distances BD5 to BD8 in the backward direction B, respectively, according to the forward and backward movement of the fifth to eighth additional rods 641 to 644. Since the pickers may be individually combined to the respective additional holder 810 to 840, the picker pitch of the pickers may be directly controlled by the additional linear driver 600.

The integral configuration of the stopper box and the base plate may reduce the assembly errors between the stopper box and the base plate and reduce an overall weight of the pitch control unit.

According to example embodiments of the pitch control unit, the pickers may be combined with the linear driver by the picker holder and thus may directly move by the linear driver without any intermediate driving members, thereby accurately and promptly controlling the picker pitch of the pickers. Further, the combination of the pickers and the linear driver without intermediate driving members may sufficiently reduce the elements of the pitch control unit and simplify the configurations of the pitch control unit, thereby preventing control errors caused by the combination errors and manufacturing errors of the elements of the pitch control unit.

Picker Assembly Having a Pitch Control Unit

Figure 9:
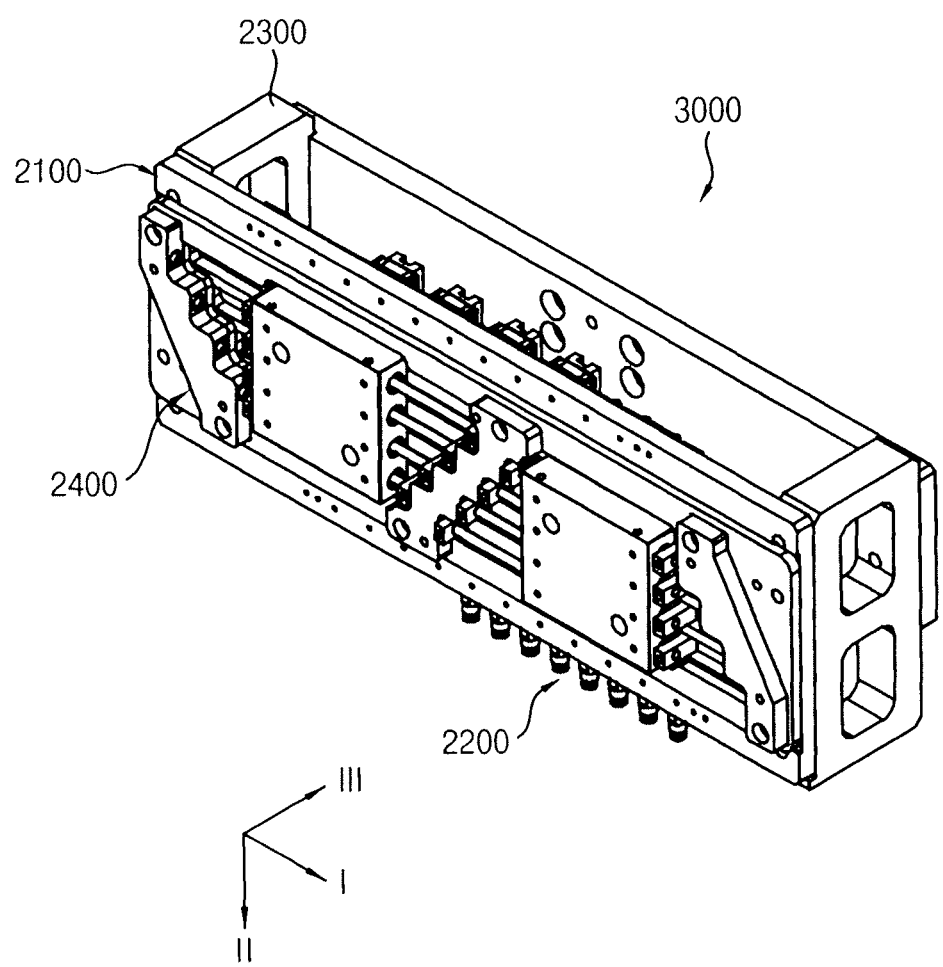
FIG. 9 illustrates a perspective view of a picker assembly of a test handler having the pitch control unit in accordance with an exemplary embodiment.
Figure 10B:
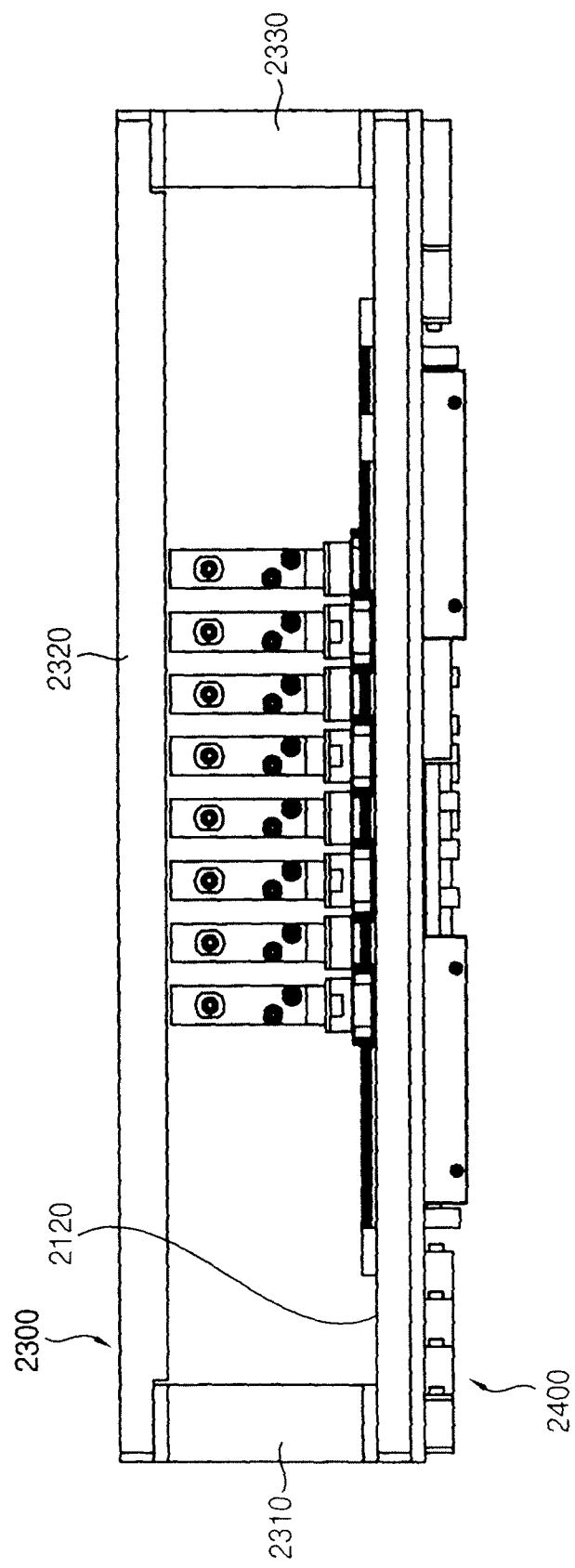
FIG. 10B illustrates a plan view of the picker assembly shown in FIG. 9.
Figure 11:
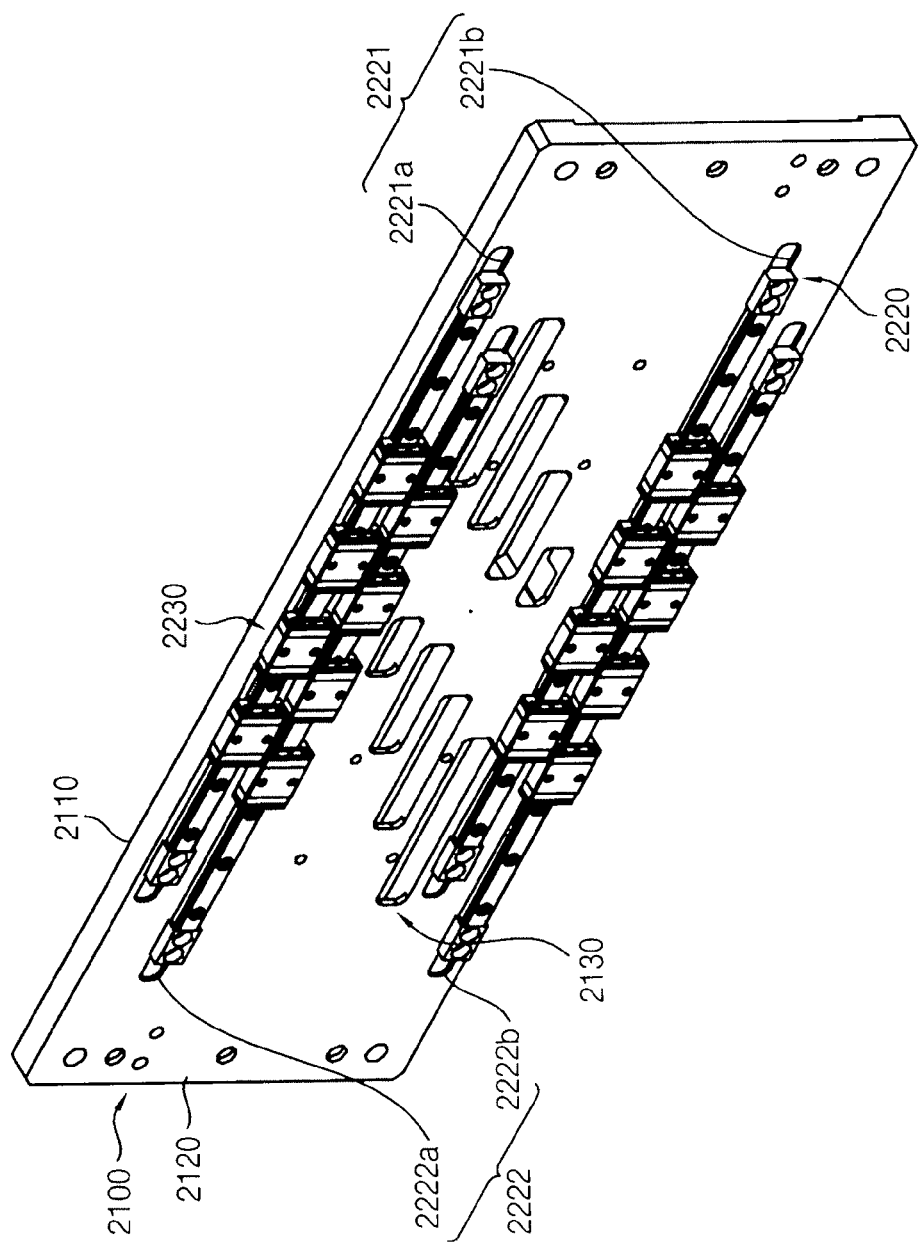
FIG. 11 illustrates a perspective view of a mother plate of the picker assembly shown in FIG. 9.
Figure 12:
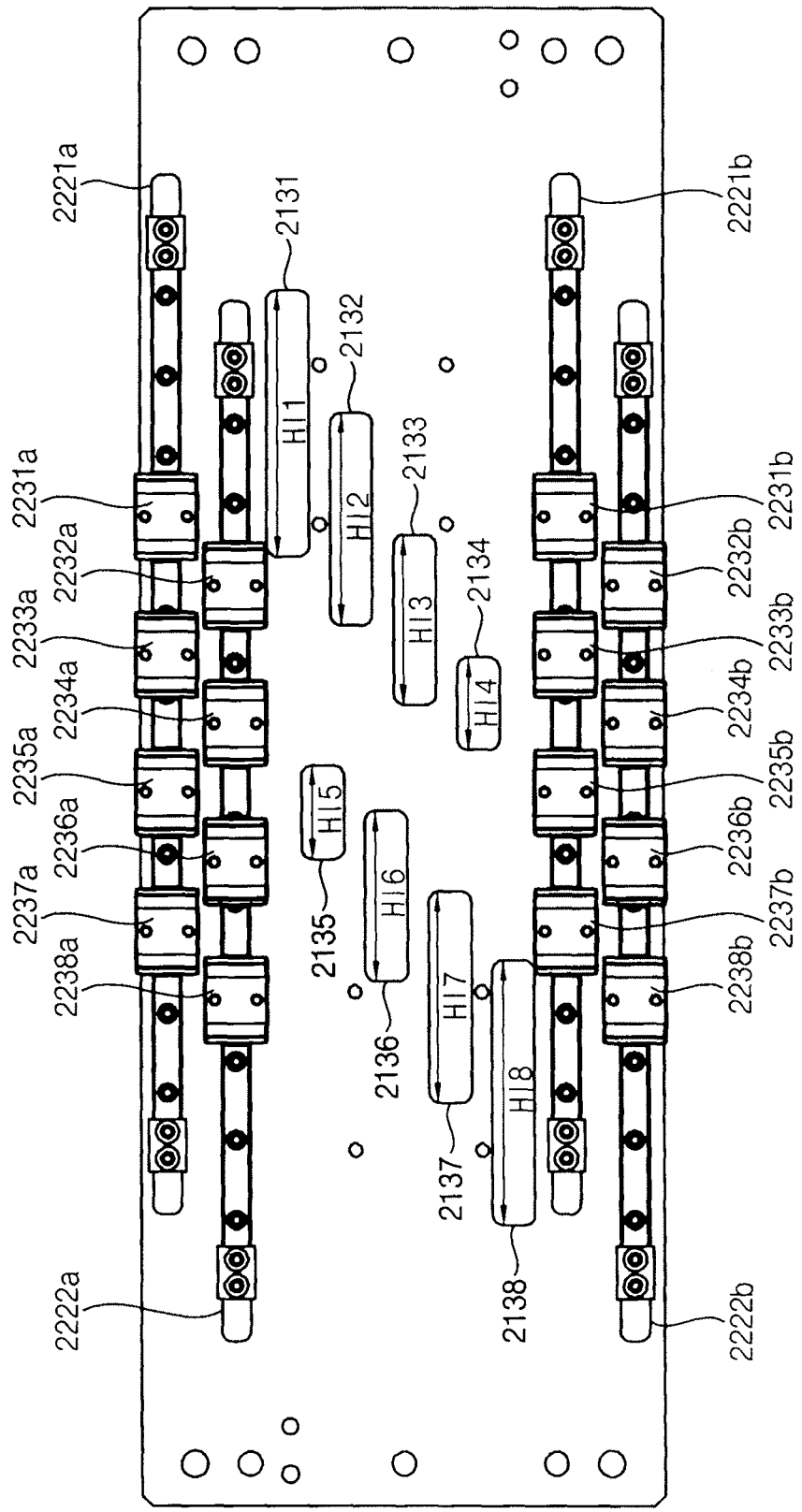
FIG. 12 illustrates a plan view of a second surface of the mother plate shown in FIG. 11.

FIG. 9 is a perspective view illustrating a picker assembly of a test handler having a pitch control unit in accordance with an exemplary embodiment. FIG. 10A is a front view illustrating the picker assembly shown in FIG. 9, and FIG. 10B is a plan view illustrating the picker assembly shown in FIG. 9. FIG. 11 is a perspective view illustrating the mother plate of the picker assembly shown in FIG. 9, and FIG. 12 is a plan view illustrating a second surface of the mother plate shown in FIG. 11.

Referring to FIGS. 9 to 12, a picker assembly 3000 in accordance with an exemplary embodiment may include a mother plate 2100 having first and second surfaces 2110 and 2120 opposite to each other and a plurality of connection holes 2130 penetrating therethrough (FIG. 11), a picking unit 2200 secured to the second surface 2120 of the mother plate 2100 and having a plurality of pickers that may be arranged and movable in a first direction I, a housing 2300 (FIG. 9) combined to the mother plate 2100 to cover the second face 2120, thereby protecting the picking unit 2200 from surroundings, and a pitch control unit 2400 secured to the first surface 2110 of the mother plate 2100 and connected to the picking unit 2200 through the connection holes 2130. The pickers 2210 (FIG. 10A) may pick objects, e.g., semiconductor packages, from one of a user, e.g., customer, tray and a test tray of the test handler, and the pitch control unit 2400 may drive the pickers 2210 to move linearly in the first direction I and control the picker pitch between neighboring pickers 2210.

In the present example embodiment, the pitch control unit 2400 may have substantially the same structure as the pitch control unit 1000 shown in FIG. 6, and thus the same reference numerals of the picker control unit 2400 denote the same elements of the picker control unit 1000 in FIG. 6. For example, the picking unit 2200 may include a plurality of pickers 2100, e.g., first to eighth pickers 2211 to 2218, that may be individually combined to each rod of the pitch control unit 2400. However, the number of the pickers may be varied according to the number of the rods of the pitch control unit.

The pitch control unit 2400 may be combined to the first surface 2110 of the mother plate 2100, and the picking unit 2200 may be combined to the second surface 2120 of the mother plate 2100. Thus, the mother plate 2100 may have sufficient strength and rigidity for supporting the pitch control unit 2400 and the picking unit 2200, as well as sufficient size for holding the pitch control unit 2400 and the picking unit 2200.

Since the pitch control unit 2400 may include the rectangular base plate 100, the first to eighth pickers 2211 to 2218 may be combined to the first to fourth rods 241 to 244 and to the fifth to eighth rods 641 to 644, and may be arranged in a line along the first direction I, the mother plate 2100 may also include a rectangular plate having a sufficient size for including the base plate 100 and a chain of the pickers 2211 to 2218.

As illustrated in FIGS. 11 and 12, a plurality of the connection holes 2130 may penetrate through the mother plate 2100, and the first and the second surfaces 2110 and 2120 may be connected with each other. The picker holders 400 and 800 of the pitch control unit 2400 may be combined to the picking unit 2200 through the connection holes 2130. In detail, the first to fourth holders 410 to 440 and the fifth to eighth holders 810 to 840 of the pick holders 400 and 800 may be individually connected to the pickers 2211 to 2218 through the connection holes 2130, respectively.

In the present example embodiment, the connection holes 2130 may include first to eighth holes 2131 to 2138 through which the first to eighth picker connectors may penetrate, respectively. Each of the first to eighth hole 2131 to 2138 may have a hole length Hl corresponding to the moving distance of the corresponding rod along the first direction I. Thus, the picker connectors may sufficiently travel the forward distances FD in the forward direction F and the backward distances BD in the backward direction B, respectively.

For examples, the first picker connector 412 of the first holder 410 may travel the first forward distance FD1 or the first backward distance BD1 as the first rod 241 may move along the forward direction F or the backward direction B. Thus, the first connection hole 2131 may have the first hole length Hl1 corresponding to the first forward distance FD1 or the first backward distance BD1 (FIG. 12).

In the same way, the second to eighth picker connectors of the second to eighth holders may travel the corresponding forward or backward distances as the second to eighth rods 242 to 244 and 641 to 644 may move along the forward direction F or the backward direction B. Thus, the second to eighth connection holes 2132 to 2138 may also have the second to eighth hole lengths Hl2 to Hl8 corresponding to the corresponding forward and backward distances FD1 and BD1.

In detail, since the holders 410 to 440 and 810 to 840 may be arranged in the second direction II, and the picker connectors of each holder 410 to 440 and 810 to 840 may be shifted along the first direction I, the first to eighth holes 2131 to 2138 may also be arranged in the second direction II while being shifted along the first direction I.

For example, when the piston rods 240 and 640 may make contact with the merge block 790 and thus the pickers 2211 to 2218 may be arranged in the first direction I at the minimal pitch Pmin, the fourth and the fifth picker connectors of the fourth and fifth holders 440 and 810 may be positioned adjacent to each other around the merge block 790, and the first and the eighth picker connectors of the first and eighth holders 410 and 840 may be positioned separately from each other and spaced off from the merge block 790. In such a case, the pickers 2211 to 2218 may be spaced apart by the minimal pitch Pmin in the first direction I.

Thus, the fourth hole 2134, which may have the fourth hole length Hl4 corresponding to the moving distance of the fourth rod 244, may be close to the merge block 790 and the third hole 2133, which may have the third hole length Hl3 greater than the fourth hole length Hl4 and corresponding to the moving distance of the fourth rod 244, may be shifted from the fourth hole 2134 by the minimal pitch Pmin and may be positioned above the fourth hole 2134. In the same way, the second hole 2132 may be shifted from the third hole 2133 by the minimal pitch Pmin and may be positioned above the third hole 2133 and finally the first hole 2131 may be shifted from the second hole 2132 by the minimal pitch Pmin and may be positioned above the second hole 2132.

Since both of the linear drivers 200 and 600 may be arranged reversely to each other, the fifth to eighth holes 2135 to 2138 may be arranged on the mother plate 2100 in the same configurations. Thus, the fifth hole 2135, which may have the fifth hole length Hl5 corresponding to the moving distance of the first additional rod 641, may be close to the merge block 790 and the sixth hole 2136, which may have the sixth hole length Hl6 greater than the fifth hole length Hl5 and corresponding to the moving distance of the second additional rod 642, may be shifted from the fifth hole 2135 by the minimal pitch Pmin and may be positioned below the fifth hole 2135. In the same way, the seventh hole 2137 may be shifted from the sixth hole 2136 by the minimal pitch Pmin and may be positioned below the sixth hole 2136 and finally the eighth hole 2138 may be shifted from the seventh hole 2137 by the minimal pitch Pmin and may be positioned below the seventh hole 2137.

That is, when the pickers 2211 to 2218 may be arranged in the first direction I at the minimal pitch Pmin, the picker connectors of the holders 410 to 440 and 810 to 840 may also be spaced apart from each other by the minimal pitch Pmin around the merge block 790.

The picking unit 2200 may be secured to the second face 2120 of the mother plate 2100 and having a plurality of the pickers 2210 that may be arranged and movable in the first direction I and may pick the objects such as the semiconductor packages from one of the customer tray and the test tray of the test handler. In the present example embodiment, the plurality of the pickers 2210 may include the first to eighth pickers 2211 to 2218 and at least a guide rail 2220 and a plurality of guide blocks 2230 may be further provided with the picking unit 2200 for movably combining the pickers 2211 to 2218 to the mother plate 2100.

The guide rail 2220 may be secured to the second face 2120 of the mother plate 2100 and extend along the first direction I. A plurality of guide the blocks 2230 may be combined to the guide rail 2220 in a line along the first direction I and may move along the guide rail 2220. Thus, the pickers 2211 to 2218 may be secured to the guide blocks 2230 and may move in the first direction I together with the guide block 2230.

For example, the guide rail 2220 may include a pair of rails that may be positioned at an upper portion and a lower portion of the mother plate 2100, so each of the pickers 2211 to 2218 may be secured to the guide rail 2220 at two securing points that may be above and below the connection holes 2130, respectively. The number of the guide rails 2220 may be varied according to the number and arrangement configuration of the pickers 2211 to 2218.

In the present example embodiment, a pair of the guide rail 2220 may be provided with the mother plate 2100. A first guide rail 2221 may be secured to the second face 2120 of the mother plate 2100 and a second guide rail 2222 may be secured to the second face 2120 under the first guide rail 2221. Therefore, the first upper rail 2221a may be arranged at the upper portion of the mother plate 2100 and the second upper rail 2222a may be arranged under the first upper rail 2221a at the upper portion of the mother plate 2100. Further, the first lower rail 2221b may be arranged at the lower portion of the mother plate 2100 and the second lower rail 2222b may be arranged under the first lower upper rail 2221b at the lower portion of the mother plate 2100.

A plurality of the guide blocks 2230 may be movably combined to the first and the second guide rails 2221 and 2222 and the pickers 2211 to 2218 may be combined to the guide blocks 2230, respectively. Since the guide blocks 2230 may move along the guide rail 2220 in the first direction I, the pickers 2211 to 2218 may also move along the guide rail 2220 in the first direction I together with the guide blocks 2230. For example, each of the guide blocks 2230 may include a pair of bearing structures that may be movably combined to the upper rail and the lower rail, respectively.

In the present example embodiment, the guide blocks 2230 may include first to eighth bearing structures 2231 to 2238 each of which may include the upper structure and the lower structure, and the first to eighth bearing structures 2231 to 2238 may be alternately combined to the first guide rail 2221 and the second guide rail 2222 in the first direction I. In FIG. 12, a subscript 'a' denotes an upper structure of the guide block 2230 that may be combined to the upper rail and a subscript 'b' denotes a lower structure of the same guide block 2230 that may be combined to the lower rail. Each of the pickers 2211 to 2218 may be secured to both of the upper and lower structures of the corresponding bearing structure of the guide block 2230.

In detail, the first bearing structure 2231 may be combined to the first guide rail 2221 in such a configuration that the first upper structure 2231a may be movably combined to the first upper rail 2221a and the first lower structure 2231b may be movably combined to the first lower rail 2221b. The first picker 2211 may be combined to both of the first upper structure 2231a and the first lower structure 2231b across the connection hole 2230 in such a configuration that the first picker 2211 may be combined to the first picker connector 412 of the first holder 410 through the first connection hole 2131. The first holder 410 may be combined to the first rod 241 via the first rod connector 413. Accordingly, the first picker 2211 may be movably combined to the mother plate 2100 by the first guide block 2231 and may be combined to the first rod 241 through the first connection hole 2131 by the first holder 410.

The second bearing structure 2232 may be combined to the second guide rail 2222 at a position shifted from the first bearing structure 2231 along the first direction I in such a configuration that the second upper structure 2232a may be movably combined to the second upper rail 2222a and the second lower structure 2232b may be movably combined to the second lower rail 2222b. The second picker 2212 may be combined to both of the second upper structure 2232a and the second lower structure 2232b across the connection hole 2230 in such a configuration that the second picker 2212 may be combined to the second picker connector 422 of the second holder 420 through the second connection hole 2132. The second holder 420 may be combined to the second rod 242 via the second rod connector 423. Accordingly, the second picker 2212 may be movably combined to the mother plate 2100 by the second guide block 2232 while being shifted from the first picker 2211 and may be combined to the second rod 242 through the second connection hole 2132 by the second holder 420.

The third bearing structure 2233 may be combined again to the first guide rail 2221 at a position shifted from the second bearing structure 2232 along the first direction I in such a configuration that the third upper structure 2233a may be movably combined again to the first upper rail 2221a and the third lower structure 2233b may be movably combined again to the first lower rail 2221b. The third picker 2213 may be combined to both of the third upper structure 2233a and the third lower structure 2233b across the connection hole 2230 in such a configuration that the third picker 2213 may be combined to the third picker connector 432 of the third holder 430 through the third connection hole 2133. The third holder 430 may be combined to the third rod 243 via the third rod connector 433. Accordingly, the third picker 2213 may be movably combined to the mother plate 2100 by the third guide block 2233 and may be combined to the third rod 243 through the third connection hole 2133 by third holder 430.

The fourth bearing structure 2234 may be combined again to the second guide rail 2222 at a position shifted from the third bearing structure 2233 along the first direction I in such a configuration that the fourth upper structure 2234a may be movably combined again to the second upper rail 2222a and the fourth lower structure 2234b may be movably combined again to the second lower rail 2222b. The fourth picker 2214 may be combined to both of the fourth upper structure 2234a and the fourth lower structure 2234b across the connection hole 2230 in such a configuration that the fourth picker 2214 may be combined to the fourth picker connector 442 of the fourth holder 440 through the fourth connection hole 2134. The fourth 440 holder may be combined to the fourth rod 244 via the fourth rod connector 443. Accordingly, the fourth picker 2214 may be movably combined to the mother plate 2100 by the fourth guide block 2234 and may be combined to the fourth rod 244 through the third connection hole 2134 by fourth holder 440.

The first to fourth pickers 2211 to 2214 may be arranged in a line along the first direction I around the merge block 790 off from the forward stopper box 310 sequentially named order. Thus, the fourth picker 2214 may be closest to the merge block 790 and the third picker 2213, the second picker 2212 and the first picker 2211 may be sequentially farther from the merge block 790. In such a case, the first to fourth pickers 2211 to 2214 may be spaced apart from each other at the minimal pitch Pmin.

In the same way, the fifth to eighth bearing structures 2235 to 2238 may be alternately combined to the first and the second guide rails 2221 and 2222 while being shifted along the first direction I in such a configuration that the upper structures 2235a to 2238a may be alternately combined to the first and the second upper rails 2221a and 2222a and the lower structures 2235b to 2238b may be alternately combined to the first and the second lower rails 2221b and 2222b. Thus, the fifth to eighth pickers 2215 to 2218 may be combined to the fifth to eighth bearing structures 2235 to 2238, respectively, in such configurations that the fifth to eighth picker connectors of the fifth to eighth holders 810 to 840 may be combined with the fifth to eighth pickers 2215 to 2218 through the fifth to eighth connection holes 2135 to 2138, respectively. Since the fifth to eighth holders 810 to 840 may be combined to the fifth to eighth rods 641 to 644, the fifth to eighth pickers 2215 to 2218 may be combined to the fifth to eighth rods 641 to 644. Accordingly, the fifth to eighth pickers 2215 to 2218 may be movably combined to the mother plate 2100 by the fifth to eighth guide blocks 2235 to 2238 and may be combined to the fifth to eighth rods 641 to 644 through the fifth to eighth connection holes 2135 to 2138 by fifth to eighth holders 810 to 840.

The fifth to eighth pickers 2214 to 2218 may be arranged in a line along the first direction I around the merge block 790 off from the additional forward stopper box 710 sequentially named order. Thus, the fifth picker 2215 may be closest to the merge block 790 and the sixth picker 2216, the seventh picker 2217 and the eighth picker 2218 may be sequentially farther from the merge block 790. In such a case, the fifth to eighth pickers 2215a to 2218 may be spaced apart from each other at the minimal pitch Pmin.

In the above minimal arrangements of the pickers 2211 to 2218, the fourth picker 2214 and the fifth picker 2215 may be combined to the mother plate 2100 in such a configuration that the gap distance between the fourth and the fifth pickers 2214 and 2215 may correspond to the minimal pitch Pmin.

According to the configurations of the pitch control unit 2400, the piston rod 240 and the additional piston rods 640 may move backward to thereby make contact with the merge block 790, and the first to eighth pickers 2211 to 2218 may be closely arranged in the first direction I at the minimal pitch Pmin.

Then, when the air flow of the compressed air CA may be changed by the controller 230, the piston rod 240 and the additional piston rods 640 may move forward to both end portions of the mother plate 2100 until the piston rod 240 may make contact with the forward stopper box 310 and the additional piston rods 640 may make contact with the additional forward stopper box 710, the first to eighth pickers 2211 to 2218 may be spaciously arranged in the first direction I at the maximal pitch Pmax.

That is, when the piston rod 240 and the additional piston rods 640 may make contact with the forward stopper box 310 and the additional forward stopper box 710, respectively, the first to eighth pickers 2211 to 2218 may be arranged in a line at the maximal pitch Pmax. In addition, when the piston rod 240 and the additional piston rods 640 may make contact with the merge block 790 including the backward stopper box 320 and the additional backward stopper box 720, the first to eighth pickers 2211 to 2218 may be arranged in a line at the minimal pitch Pmin.

Since each of the pickers 2211 to 2218 may be combined to the respective guide block, the interrupts of the movement between the neighboring pickers may be sufficiently prevented while the pickers 2211 to 2218 may move in the first direction I between the maximal position having the maximal pitch Pmax and the minimal position having the minimal pitch Pmin.

Thus, the picker pitch of the pickers 2211 to 2218 may be directly and individually controlled by the linear motion of the guide blocks 2130 that may be operated by the linear drivers 200 and 600 without any intermediate driving members such as a link system and a cam driver. In addition, the configurations of the pitch control unit may be remarkably simplified due to the replacement of intermediate driving members with the linear drivers, thereby reducing the assembly errors and manufacturing errors of the pitch control unit 2400 and increasing the picking accuracy of the picker assembly 3000.

Figure 13:
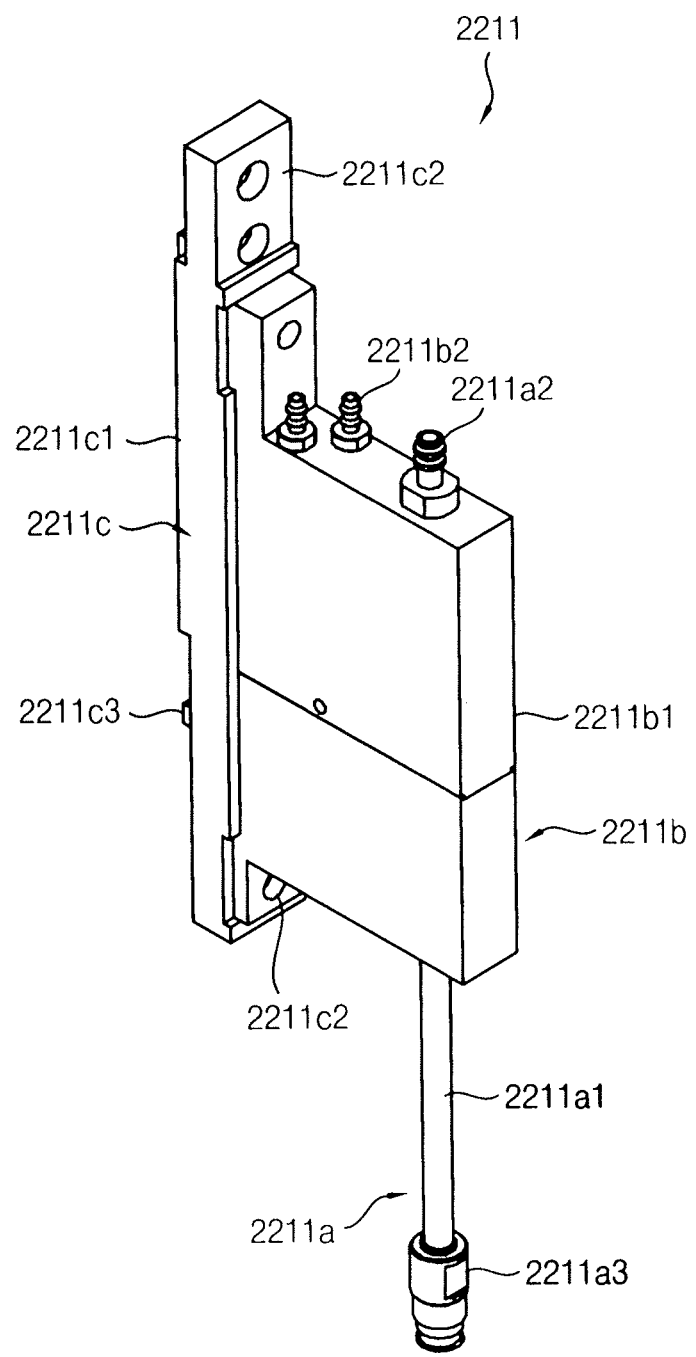
FIG. 13 illustrates a perspective view of the picker of the picker assembly shown in FIG. 9.
Figure 14:
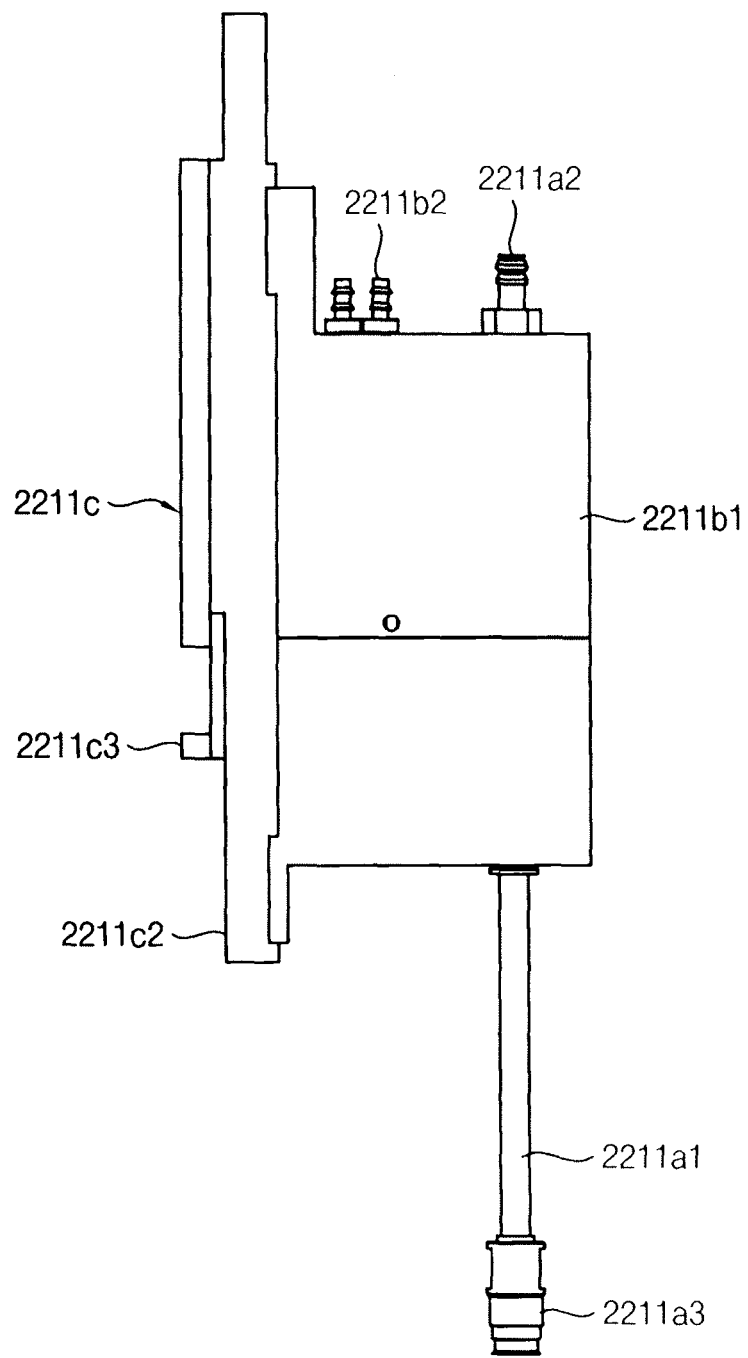
FIG. 14 illustrates a front view of the picker shown in FIG. 13.

FIG. 13 is a perspective view illustrating the picker of the picker assembly shown in FIG. 9, and FIG. 14 is a front view of the picker shown in FIG. 13. In FIGS. 13 and 14, the structures and configurations of the picker 2210 will be described in detail with respect to the first picker 2211 for convenience sake. The second to eighth pickers 2212 to 2218 have substantially the same structures as the first picker 2211.

Referring to FIGS. 13 and 14, the first picker 2211 may include an absorber 2211a absorbing an object from the customer tray or the test tray of a test handler, a picker driver 2211b driving the absorber 2211a to linearly move in the second direction II and a picker joint 2211c combined to the guide block 2230. The picker joint 2211c may move according as the guide block 2230 may move along the guide rail 2220, and as a result, the picker driver 2211b and the absorber 2211a may also move in the first direction I.

For example, the absorber 2211a may include a tube 2211a1 extending along the second direction II, a vacuum port 2211a2 positioned at a first end portion of the tube 2211a1 and applying a vacuum pressure to the tube 2211a1 and a contact pad 2211a3 positioned at a second end portion of the tube 2211a1 and absorbing the object such as the semiconductor package. Thus, the object may be absorbed onto the contact pad 2211a3 of the absorber 2211a by the vacuum pressure.

The picker driver 2211b may include a cylindrical body 2211b1 having a cylinder (not shown) and a power port 2211b2 for applying a driving power to reciprocate the cylinder in the second direction II. In the present example embodiment, the pick driver 2211b may include a pneumatic cylinder structure in which the piston may be reciprocated by compressed air.

The tube 2211a1 may be combined to the cylinder of the picker driver 2211b and may be reciprocated in the second direction II according as the piston may move upward and downward in the second direction II.

The picker joint 2211c may include a joint body 2211c1 extending in the second direction II and holding the cylindrical body 2211b1 of the picker driver 2211b. First and second joints 2211c2 and 2211c3 may be provided with the joint body 2211c1. The first joint 2211c2 may be combined with the first guide block 2231 and the second joint 2211c3 may be combined with the first picker connector 412 of the first holder 410.

In the present example embodiment, the first joint 2211c2 may include a pair of couplers that may be arranged at both end portions of the joint body 2211c1 and may be coupled to the upper and lower structures 2231a and 2231b of the bearing structure of the first guide block 2231. The second joint 2211c3 may include a protrusion that may be protruded from the joint body 2211c1 toward the first connection hole 2131. Thus, the first picker connector 412 may be combined with the second joint 2211c3 through the first connection hole 2231. For example, the second joint 2211c3 may include a screw joint.

Referring to again FIGS. 9 and 10B, the housing 2300 may include a pair of side plates 2310 and 2330 that may be protruded from the second face 2120 of the mother plate 2100 and a single rear plate 2320 that may be connected to the side plates 2310 and 2330 and may face the mother plate 2100. Thus, the mother plate 2100 and the housing 2300 may define an inner space IS and the picking unit 2200 may be arranged in the inner space IS. Although not shown in figures, a cover may be further provided with the picker assembly 3000 to cover an upper portion of the inner space IS. Therefore, the picking unit 2200 in the inner space IS may be protected from surroundings, thereby reducing the maintenance cost of the picker assembly 3000.

A lower portion of the inner space IS may communicate with surroundings, and the absorber 2211a may extend downwardly to an exterior of the housing 2300 through the lower portion of the inner space IS.

The pitch control unit 2400 may include the linear drivers 200 and 600, the stopper boxes 300 and 700 and the picker holders 400 and 800, so that the first to eighth rods may be combined with the first to eighth pickers 2211 to 2218. Therefore, the picker pitch of the pickers 2211 to 2218 may be directly and individually controlled by the linear drivers 200 and 600 without any intermediate driving members such as a link system and a cam driver. In addition, the configurations of the pitch control unit may be remarkably simplified due to the replacement of intermediate driving members with the linear drivers, thereby reducing the assembly errors and manufacturing errors of the pitch control unit 2400 and increasing the picking accuracy of the picker assembly 3000. The pitch control unit 2400 may have substantially the same structures as the pitch control unit 1000 shown in FIG. 6, thus any further detailed descriptions of the pitch control unit 2400 will be omitted.

The maximal pitch Pmax and the minimal pitch Pmin of the picking unit 2200 may be easily changed just by exchanging the pitch control unit 2400, thereby increasing the operation conveniences and decreasing the maintenance cost. For example, when the picker pitch may need to change, the combination of the rod connector and the rod and the combination of the picker connector and the picker may be released and then the pitch control unit 2400 may be easily separated from the mother plate 2100 of the picker assembly 3000. Then, a new pitch control unit to which new linear drives having different moving distances of rods may be installed arranged may be secured to the mother plate 2100. Thus, the pickers may move in the first direction I according to the new moving distances of the piston rod, and thus the maximal and minimal pitches of the pickers may be easily changed.

While the present example embodiments disclose eight pickers and thus eight objects may be simultaneously picked up by using the above picker assembly 3000, the picker assembly may also be modified to have more pickers in series along the first direction I or in parallel along the second direction II. Thus, many more objects may also be picked up just by a simple modification of the picker assembly. The objects may include, e.g., semiconductor packages, and the picker assembly 3000 may be provided with a test handler for an electrical die sorting process to the semiconductor packages.

According to example embodiments of the picker assembly, the picker pitch of the pickers may be directly and individually controlled by the linear motion of the guide blocks, which may be operated by linear drivers without any intermediate driving members such as a link system and a cam driver, thereby accurately and promptly controlling the picker pitch of the pickers. In addition, the configurations of the pitch control unit may be remarkably simplified due to the replacement of intermediate driving members just with the linear drivers for generating the linear motion and the stopper bodies for individually stopping the linear motion, thereby reducing the assembly errors and manufacturing errors of the pitch control unit and increasing the picking accuracy of the picker assembly.

Test Handler Having the Picker Assembly

Figure 15:
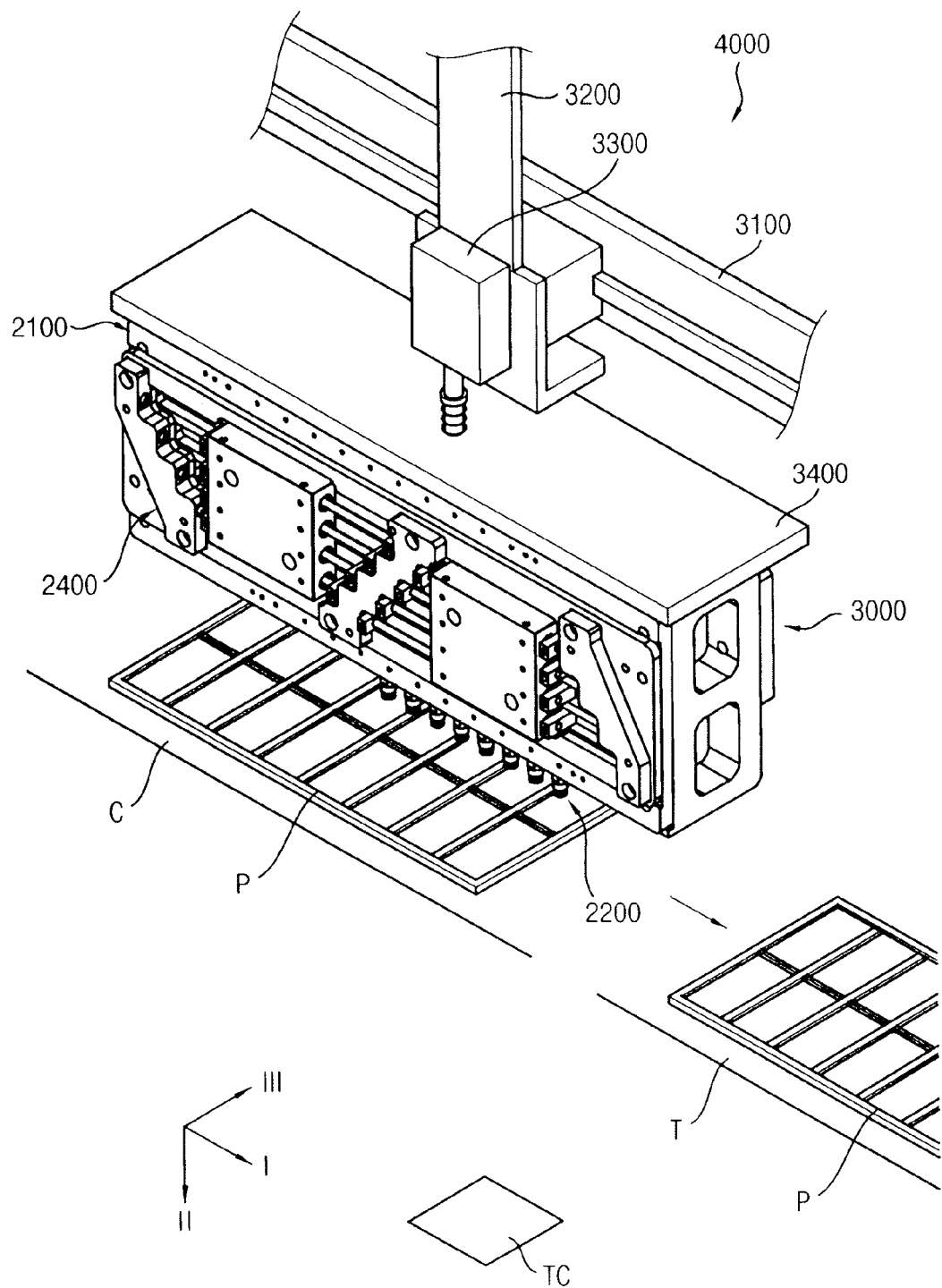
FIG. 15 illustrates a perspective view of a test handler for testing semiconductor packages including the picker assembly shown in FIG. 9.

FIG. 15 is a perspective view illustrating a test handler for testing semiconductor packages including the picker assembly shown in FIG. 9.

Referring to FIG. 15, a test handler 4000 for inspecting semiconductor packages may include a transfer line 3100, a transfer block 3200 movably combined to the transfer line 3100, and a picker assembly 3000 combined to the transfer block 3200 and moving along the transfer line 3100 in such a way that the picker assembly 3000 may be aligned with an underlying tray containing a plurality of the semiconductor packages and may pick up or locate down a plurality of the semiconductor packages from or into the tray.

A cover 3400 may be provided on the picker assembly 3000 and the transfer block 3200 may be secured to the cover 3400. An elevator 3300 may be further provided with the transfer block 3200, thus the picker assembly 3000 may move upward and downward in a vertical direction. The picker assembly 3000 may have the same structures as the picker assembly shown in FIG. 9, and thus any detailed descriptions of the picker assembly will be omitted hereinafter.

The tray may include a customer try C and a test tray T, and the picker assembly 3000 may pick up and transfer the semiconductor packages between the customer tray C and the test tray T.

The customer tray C and the test tray T may be spaced apart from each other in the test handler and a plurality of the semiconductor packages P, which may be to be tested, may be located in first sockets of the customer tray C, respectively. A plurality of the packages P may be picked up simultaneously from the first sockets of the customer tray C by the picker assembly 3000 in such a way that the packages P may be absorbed to the contact pad 2211a3. Thereafter, the picker assembly 3000 may move to the test tray T and the packages P may be located into respective second socket of the test tray T. Then, the test tray T holding the packages P may be loaded into a test chamber TC of the test handler and an electrical inspection or test process such as an electrical die sorting (EDS) process may be performed to the packages P of the test tray T in the test chamber IC. After completing the test process, the DUTs may be classified into bad devices and good devices according to the test results.

In the above test handler, the first sockets of the customer tray C may be spaced apart from each other by a first gap distance corresponding to the minimal pitch Pmin and the second sockets of the test tray T may be spaced apart from each other by a second gap distance corresponding to the maximal pitch Pmax. The picker assembly 3000 may pick up the DUTs from the first sockets of the customer tray C and may locate the packages P into the second sockets of the test tray T and the picker pitch of the picker assembly 3000 may be accurately controlled by the pitch control unit 2400.

When picking the packages P from the first sockets of the customer tray C, the piston rods 240 and 640 may make contact with the merge block 790 including the backward stopper boxes 320 and 720 and thus the first to eighth pickers 2211 to 2218, which may be combined to the first to eighth rods 241 to 244 and 641 to 644, respectively, may be arranged at the minimal pitch Pmin. Therefore, the pickers 2211 to 2218 may be accurately aligned with the first sockets of the customer tray C and the absorbers of each picker may move downward to the respective first socket by the picker driver. Eight packages P may be simultaneously absorbed to the contact pad of the respective picker from the respective socket of the customer tray C.

Thereafter, the absorber may move upward from the customer tray C by the picker driver and the picker assembly 3000 may move toward over the test tray T along the transfer line 3100. When locating the packages P into the second sockets of the test tray T, the piston rods 240 and 640 may make contact with the forward stopper boxes 310 and 710 and thus the first to eighth pickers 2211 to 2218, which may be combined to the first to eighth rods 241 to 244 and 641 to 644, respectively, may be arranged at the maximal pitch Pmax just by the respective linear motion of the rods 241 to 244 and 641 to 644. Therefore, the pickers 2211 to 2218 may be easily and accurately aligned with the second sockets of the test tray T and the absorbers of each picker may move downward to the respective second socket by the picker driver. Eight packages P may be simultaneously located into the respective second sockets and separated from the contact pads of the respective picker. Thus, eight packages P may simultaneously be accurately located in the respective second socket of the test tray T.

While the present example embodiments disclose that eight packages may be simultaneously picked up from the customer tray C and located into the test tray T, more packages may also be picked up from the customer tray C and located into the test tray T just by increasing the pickers 2200 of the picker assembly 3000. The increase of the pickers 2200 may be easily conducted just by modifying the picker assembly to have more pickers in series along the first direction I or in parallel along the second direction II.

According to the example embodiments of the picker control unit and the picker assembly including the same, the pitch conversion between the minimal picker pitch and the maximal picker pitch may be easily and accurately conducted just by the direct linear motion of the piston rod to which each picker may be individually combined, thereby increasing the accuracy of the pitch control. Therefore, the picking failure at the customer tray C and the location failure at the test tray T may be sufficiently reduced by the picker assembly, thereby increasing the operation efficiency of the test handler.

Recently, the electrical test has been conducted by a unit of thirty-two packages in place of a unit of eight packages due to the size reduction of the semiconductor packages, so that thirty-two packages may be simultaneously picked up from the customer tray C and located into the test tray T, which may remarkably increase the possibility of the picking failure and the location failure due to the misalignment between the pickers and the sockets of the tray.

When any one of the pickers corresponding to eight to thirty-two packages may be misaligned any one of the sockets of the customer tray C or the test tray T, the operation of the test handler may be totally stopped and the picker pitch need be controlled and adjusted again, which may remarkably reduce the overall efficiency of the test handler.

However, the picker pitch of the pickers of the embodiments may be directly and individually controlled by the linear motion of the guide blocks that may be operated by the linear drivers without any intermediate driving members such as a link system and a cam driver, and thus the picker pitch of the pickers may be accurately and promptly controlled and may minimize the misalignment between the pickers and the sockets of the tray. Accordingly, the test handler may be prevented from frequent operation failures and may increase the test efficiency. In addition, the configurations of the pitch control unit may be remarkably simplified due to the replacement of intermediate driving members just with the linear drivers for generating the linear motion and the stopper bodies for individually stopping the linear motion, thereby reducing the assembly errors and manufacturing errors of the pitch control unit and increasing the picking accuracy of the picker assembly. The present example embodiments of the test handler may be applied to various electrical test systems for testing electrical characteristics of electronic devices including integrated circuit chips and fine circuit devices.

By way of summation and review, a conventional picker assembly having a conventional pitch control unit has a complicated structure, e.g., includes a CAM driver, so that various errors may be generated during manufacturing elements thereof and during assembling the elements into the picker assembly. Thus, for example, tray sockets for receiving DUTs in the customer and test trays may not be accurately aligned with respective pickers, and as a result, the picking accuracy of the pickers may significantly decrease.

In detail, since the gap distances of sockets in the customer tray are different from those of the sockets in the test tray, the pitch control unit of the conventional picker assembly changes the picker pitch when the picker assembly moves between the customer tray and the test tray. However, the conventional pitch control unit may utilize a CAM driver for changing the picker pitch, i.e., in which the picker pitch is controlled by adjusting the vertical moving distance of each picker, which reduces the accuracy of the picker pitch change. In addition, the semiconductor packages are usually separated from the picker due to the absorption failures when transferring from the customer tray to the test tray by the conventional picker assembly. As such, the inaccurate pitch control and the complicated structure of the picker assembly may substantially reduce the overall efficiency of the test handler.

In contrast, according to example embodiments, a picker pitch of the pickers may be directly and individually controlled by a linear motion of guide blocks operated by linear drivers without any intermediate driving members, e.g., without a link system or a cam driver, thereby accurately and promptly controlling the picker pitch of the pickers. That is, pickers of the picker assembly are directly combined with respective rods that move linearly, i.e., in a horizontal direction, by a linear driver (instead of the CAM driver). Accordingly, the picker pitch is changed in the horizontal direction just by varying the linear moving distance of the rods to which the pickers are combined, respectively, rather than varying the vertical moving distance of each picker. That is, according to embodiments, an indirect control of the picker pitch via a CAM driver is replaced with a direct linear control of the picker pitch by using a linear driver. In addition, the configurations of the pitch control unit may be remarkably simplified due to the replacement of intermediate driving members just with linear drivers for generating the linear motion and the stopper bodies for individually stopping the linear motion, thereby reducing the assembly errors and manufacturing errors of the pitch control unit and increasing the picking accuracy of the picker assembly.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pitch control unit of a picker assembly for picking objects, the pitch control unit comprising:
   a base plate having an opening therethrough;
   a linear driver attached to the base plate in the opening, the linear driver including a plurality of rods linearly movable in a first direction, the plurality of rods being spaced apart from each other in a second direction;
   a stopper box attached to the base plate and including a plurality of stopper bodies, the plurality of stopper bodies individually face the plurality of rods of the linear driver to stop respective moveable rods at different moving distances from each other; and
   a picker holder attached to the linear driver, the plurality of rods of the linear driver being individually attached to pickers arranged in the first direction to pick the objects, and a picker pitch of the pickers being controlled by the different moving distances of the plurality of rods.

2. The pitch control unit as claimed in claim 1, wherein the linear driver includes:
   a cylinder of a pneumatic actuator into which a compressed air flows;
   a piston positioned in the cylinder and connected with the plurality of rods; and
   a controller to control the piston to linearly move forward or backward in the first direction by changing air flow of the compressed air.

3. The pitch control unit as claimed in claim 2, wherein the stopper box includes a forward stopper box to stop forward movement of the plurality of rods individually, and a backward stopper box to stop backward movement of the plurality of rods individually.

4. The pitch control unit as claimed in claim 1, wherein the picker holder includes a plurality of holders corresponding to the plurality of rods in a one-to-one arrangement, each of the plurality of holders including:
   a slim body extending in the first direction,
   a picker connector protruding from the slim body and connected to a corresponding picker of the pickers, and
   a rod connector protruding from the slim body and connected to a corresponding rod of the plurality of rods through the opening.

5. The pitch control unit as claimed in claim 4, wherein the picker connectors are arranged in the second direction, while being shifted according to the moving distances of the corresponding rods in the first direction, so that the pickers are arranged at one of a maximal pitch and a minimal pitch when the plurality of rods make individual contact with corresponding stopper bodies.

6. The pitch control unit as claimed in claim 1, wherein the base plate and the stopper box are integrated into one body.

7. A picker assembly for picking objects, comprising:
   a mother plate having first and second surfaces opposite to each other and a plurality of connection holes penetrating therethrough;
   a picking unit secured to the second surface of the mother plate and having a plurality of pickers arranged and movable in a first direction, the plurality of pickers picking the objects from one of a customer tray and a test tray;
   a housing attached to the mother plate to cover the second surface, the housing protecting the picking unit from surroundings; and
   a pitch control unit secured to the first surface of the mother plate and connected to the picking unit through the connection holes, the pitch control unit driving the plurality of pickers to move linearly in the first direction and controlling a picker pitch between neighboring pickers.

8. The picker assembly as claimed in claim 7, wherein the pitch control unit includes:
   a base plate secured to the mother plate and having a penetrating opening that communicates with the connection holes;
   a linear driver combined with the base plate in the opening and having a plurality of rods that is linearly movable in the first direction and is arranged in a second direction;
   a stopper box combined with the base plate and corresponding to the linear driver, the stopper box having a plurality of stopper bodies individually facing the plurality of rods to individually stop linear movement of corresponding rods at different moving distances from one another; and
   a picker holder combined with the linear driver, the plurality of rods being attached to the plurality of pickers by one-to-one arrangement, and the picker pitch is controlled by the moving distance of each rod.

9. The picker assembly as claimed in claim 8, wherein:
   the linear driver includes a pneumatic actuator to drive a piston connected to the plurality of rods to linearly move forward and backward in the first direction, and
   the stopper box includes a forward stopper box to individually stop forward movement of the plurality of rods, and a backward stopper box to individually stop backward movement of the plurality of rods.

10. The picker assembly as claimed in claim 9, wherein:
    the pneumatic actuator includes first and second double acting cylinder structures arranged in the first direction, and
    the stopper box includes a first forward stopper box to individually stop forward movement of first rods of the plurality of rods connected with the first double acting cylinder structure, a first backward stopper box to individually stop backward movement of the first rods, a second forward stopper box to individually stop forward movement of second rods of the plurality of rods connected with the second double acting cylinder structure, and a second backward stopper box to individually stop backward movement of the second rods.

11. The picker assembly as claimed in claim 10, wherein:
    the plurality of pickers is connected to the first and the second rods sequentially and is arranged in a line along the first direction, and
    the first backward stopper box and the second backward stopper box are positioned adjacent to each other at a central portion of the base plate, the plurality of pickers being arranged at a maximal pitch when the first and the second rods move forward to two end portions of the base plate along the first direction, and are arranged with minimal pitch when the first and the second rods move backward to the central portion of the base plate along the first direction.

12. The picker assembly as claimed in claim 11, wherein the moving distances of the first rods decrease along the second direction and the moving distances of the second rods increase along the second direction.

13. The picker assembly as claimed in claim 8, wherein the picking unit includes:
   at least a guide rail secured to the second surface of the mother plate and extending along the first direction, and
   a plurality of guide blocks combined with the guide rail in a line along the first direction and movable along the guide rail, the plurality of pickers being secured to the guide blocks and movable in the first direction together with the guide block.

14. The picker assembly as claimed in claim 13, wherein each of the plurality of picker includes an absorber absorbing the object from the customer tray or the test tray, a picker driver to drive the absorber to reciprocate in the second direction, and a picker joint combined with the guide block.

15. The picker assembly as claimed in claim 13, wherein the picker holder includes a plurality of holders corresponding to the plurality of rods by one-to-one arrangement, and each of the plurality of holders includes a slim body extending in the first direction, a picker connector protruding from the slim body and connected to the guide block through the connection hole, and a rod connector protruding from the slim body and connected to the rod through the opening, and the connection hole has a hole length greater than the moving distance of the rod corresponding thereto.

16. A pitch control unit of a picker assembly for picking objects, the pitch control unit comprising:
   a base plate having an opening therethrough;
   a linear driver attached to the base plate in the opening, the linear driver including a plurality of rods linearly movable in a first direction within the opening of the base plate, the plurality of rods being spaced apart from each other in a second direction;
   a stopper box attached to the base plate and including a plurality of stopper bodies, the plurality of stopper bodies facing corresponding rods and being arranged at different distances from the corresponding rods; and
   a picker holder attached to the plurality of rods through the opening, each rod of the plurality of rods being connected to a corresponding picker via an independent picker connector, and a picker pitch of the pickers being defined by distances between picker connectors in accordance with the different distances of the stopper bodies.

17. The pitch control unit as claimed in claim 16, wherein the picker holder includes a plurality of holders spaced apart from each other in the second direction and corresponding to the plurality of rods, each of the plurality of holders including:
   a linear member extending in the first direction,
   the picker connector protruding from the linear member and connected to a corresponding picker of the pickers, the picker connector extending along a direction normal to a surface of the base plate,
   a rod connector protruding from the linear and connected to a corresponding rod of the plurality of rods through the opening.

18. The pitch control unit as claimed in claim 17, wherein the plurality of stopper bodies is arranged in a descending step structure along the second direction, the distances between the stopper bodies and the corresponding rods being measured along the first direction and being gradually decreasing along the second direction, and the plurality of rods being movable along the decreasing distances.

19. The pitch control unit as claimed in claim 18, wherein the picker connectors of the picker holder are spaced apart from each other along the second direction and are movable with the plurality of rods, respectively, the picker pitch corresponding to spaces between adjacent picker connectors.

20. The pitch control unit as claimed in claim 16, wherein the plurality of rods is movable simultaneously.

* * * * *